(12) United States Patent
Ip et al.

(10) Patent No.: US 10,380,295 B1
(45) Date of Patent: Aug. 13, 2019

(54) METHODS, SYSTEMS, AND ARTICLES OF MANUFACTURE FOR X-BEHAVIOR VERIFICATION OF AN ELECTRONIC DESIGN

(71) Applicant: Cadence Design Systems, Inc., San Jose, CA (US)

(72) Inventors: Chung-Wah Norris Ip, Cupertino, CA (US); Georgia Penido Safe, Belo Horizonte (BR)

(73) Assignee: Cadence Design Systems, Inc., San Jose, CA (US)

( * ) Notice: Subject to any disclaimer, the term of this patent is extended or adjusted under 35 U.S.C. 154(b) by 680 days.

(21) Appl. No.: 15/087,725

(22) Filed: Mar. 31, 2016

(51) Int. Cl.
*G06F 17/50* (2006.01)

(52) U.S. Cl.
CPC ........ *G06F 17/504* (2013.01); *G06F 17/5045* (2013.01)

(58) Field of Classification Search
USPC ........................................................ 716/106
See application file for complete search history.

(56) References Cited

U.S. PATENT DOCUMENTS

2016/0055287 A1* 2/2016 Hartung .............. G06F 17/5081
716/102

OTHER PUBLICATIONS

Jason Yu, "SystemVerilog and Verilog X Optimism Verilog Pro", http://www.verilogpro.com/systemverilogverilogxoptimism/, Aug. 19, 2015.
Jason Yu, "Verilog X Optimism What About X Pessimism? Verilog Pro", http://www.verilogpro.com/systemverilogverilogxoptimismpessimism/, Aug. 25, 2015.
Jason Yu, "X Propagation Archives Verilog Pro", http://www.verilogpro.com/tag/xpropagation2/, Aug. 30, 2015.
Turpin, Mike, and Principal Verification Engineer. "The Dangers of Living with an X (bugs hidden in your Verilog)." Synopsys Users Group Meeting. 2003.
Piper, Lisa, and Vishnu Vimjam. "X-propagation woes: Masking bugs at RTL and unnecessary debug at the netlist." DVCon (2012).

* cited by examiner

*Primary Examiner* — Eric D Lee
(74) *Attorney, Agent, or Firm* — Vista IP Law Group, LLP

(57) ABSTRACT

Disclosed are techniques for verifying X-behavior in electronic designs. These techniques identify at least a portion of an electronic design, wherein the at least the portion that includes an input node, an output node, and an internal node located between the input node and the output node. Internal X-propagation proof results may be generated for the internal node based in part or in whole upon an internal precondition and an internal harmless condition for the internal node. X-propagation verification for the output node may then be performed based in part upon one or more assumed properties at the internal node, wherein the one or more assumed properties are assumed at the internal node based in part or in whole upon the internal X-propagation proof results.

32 Claims, 16 Drawing Sheets assign a_d[1] g1 || en ? i_in1 : a_q[1];
always_ff @ (posedge clk)
    a_q[1] <= a_d[1]

Extracted Precondition: ~ g1 || en

FIG. 5L

Input DmxPdmC_Req1FlitData;

Extracted Precondition: ~ DmxPdmC_Req1FlitData

FIG. 5M reg [DATA_WIDTH-1:0] a_d_;
always @ (i_in1 or i_in2 or sel) begin
    case (sel)
        2'b01:    a_d_ <= i_in1;
        2'b10:    a_d_ <= i_in2;
    endcase
end always_ff @ (posedge clk) begin
    a_q[9] <= a_d_;
end Extracted Precondition: ~ (sel == 1'b01 || (sel == 2'b10)

FIG. 5N

```
always_ff @ (posedge clk) begin
    if (sel == 2'b01)
        a_q[10] = i_in1;
    else
        a_q[10] = i_in2;
end
```

Extracted Precondition: ~ true

FIG. 50

METHODS, SYSTEMS, AND ARTICLES OF MANUFACTURE FOR X-BEHAVIOR VERIFICATION OF AN ELECTRONIC DESIGN

COPYRIGHT NOTICE

A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

Modern electronic design automation (EDA) tools are devised to communicate design intent and the circuit behavior between a circuit designer and other technical personnel such as design team member. To facilitate better understanding and more versatility in the applications of these EDA tools, textual and/or graphical interfaces are often provided in these EDA tools so as to enhance the understanding and visualization of various aspects of an electronic design. With the number of transistors in an integrated circuit (IC) doubling approximately every two years according to the Moore's law, contemporary electronic designs have become increasingly bigger and more complex over time.

X-propagation verification is an important area for both simulation and formal verification. Traditionally, ~$isunknown(s) has been used as a property to be verified for a signal (e.g., signal "s"), optionally modified by the user with a condition to form an expression such as "cond|→~$isunknown(s)". Capturing X-behavior or performing X-propagation verification has presented a serious challenge to designers, especially in view of the ever increasingly complex designs. Convention approaches present less than desired or satisfactory solutions in that these conventional approaches for X-propagation verification often require different specifications or representations for different types of nets.

Conventional approaches for X-propagation verification also lack an effective solution to handle a complex design having complex logic elements between the input node and an internal node and also between an internal node and the output node. With such a complex design, conventional approaches lack an effective way to hierarchically decompose the X-propagation verification task into smaller subtasks while achieving a satisfactory solution.

Therefore, there exists a need for a method, system, and computer program product for verifying X-behavior in an electronic design to capture X-propagation behavior (or X-behavior) at the net level by extracting precondition and harmless conditions. These techniques described herein may also generate the X-propagation specification for an electronic design or a portion thereof from the RTL (register transfer level) design and use the X-propagation specification for hierarchical verification decomposition. These techniques provide a unified specification for different types of nets and further provide the users with the capabilities to manipulation various aspects of the X-propagation verification.

SUMMARY

Disclosed are method(s), system(s), and article(s) of manufacture for verifying X-behavior in an electronic design in various embodiments. Some first embodiments are directed at a method for verifying X-behavior in an electronic design. In these embodiments, at least a portion of an electronic design is identified, wherein the at least the portion that includes an input node, an output node, and an internal node located between the input node and the output node. Internal X-propagation proof results may be generated for the internal node based in part or in whole upon an internal precondition and an internal harmless condition for the internal node. X-propagation verification for the output node may then be performed based in part upon one or more assumed properties at the internal node, wherein the one or more assumed properties are assumed at the internal node based in part or in whole upon the internal X-propagation proof results.

In some of these embodiments, a first block located between the input node and the internal node and a second block located between the internal node and the output node may be identified; the internal precondition for the internal node may be extracted based in part or in whole upon analyzing at least a portion of the first block; and the internal harmless condition may also be extracted based in part or in whole upon analyzing at least a portion of the second block.

In some of the immediately preceding embodiments, an input harmless condition may be extracted for the input node based in part or in whole upon analyzing at least a part of the first block; or an output precondition may be extracted for the output node based in part or in whole upon analyzing at least a part of the second block. In addition or in the alternative, an input precondition and an output harmless condition may be respectively identified for the input node and the output node. In some embodiments, the X-propagation verification for the internal node may be performed to generate the internal proof results at least by comparing the internal precondition to or with the internal harmless condition; and the one or more assumed properties may be assumed at the internal node based in part or in whole upon the internal X-propagation proof results for the internal node.

In some embodiments, a first hierarchy at which the at least the portion of the electronic design is located may be identified; and a first block located at a second hierarchy below the first hierarchy and between the input node and the internal node may also be identified. In addition, a second block located at the second hierarchy and between the internal node and the output node may be identified; and hierarchical verification decomposition may be performed for the at least the portion of the electronic design at the first hierarchy.

In some of these embodiments, the hierarchical verification decomposition may be performed for the second hierarchy; an input precondition and an output harmless condition may be respectively identified for the output node and the input node. In addition or in the alternative, the second block may be elaborated while keeping a remainder of the at least the portion of the electronic design unelaborated; and a fanin cone of influence driving the output node may be determined for the output node. In addition, analysis results may be generated for the output node at least by analyzing at least a part of the second block at the second hierarchy based in part or in whole upon the output cone of influence; and an output precondition may be extracted for the output node based in part or in whole upon the analysis results for the output node.

In some of these immediately preceding embodiments, an output harmless condition may be identified for the output node; and an internal harmless condition may be extracted for the internal node based in part or in whole upon analysis results for the internal node.

In some embodiments, performing the hierarchical verification decomposition may further include elaborating the first block while keeping a remainder of the at least the portion of the electronic design unelaborated and determining an input cone of influence for the input node. Analysis results may be generated for the input node at least by analyzing at least a part of the first block at the second hierarchy based in part or in whole upon the fanout cone of influence of the input node; and an input harmless condition may be extracted for the input node based in part or in whole upon the analysis results for the input node.

In some of these embodiments, an input precondition may be identified for the input node; and an internal precondition may also be extracted for the internal node based in part or in whole upon analysis results for the internal node. In addition or in the alternative, the internal precondition and the internal harmless condition may be identified for the internal node; internal X-propagation verification results may be generated for the internal node at least by performing the X-propagation verification for the internal node by comparing the internal precondition to or with the internal harmless condition, with or without conducting a formal analysis of the logic in the first block; and one or more assumed properties may be assumed for the internal node based in part or in whole upon the internal X-propagation verification results. The output X-propagation verification results may then be generated for the output node at least by performing the X-propagation verification for the output node using at least the one or more assumed properties at the internal node.

Some second embodiments are directed at a method for verifying X-behavior in an electronic design. In these second embodiments, at least a portion of an electronic design may be identified, wherein the at least the portion of the electronic design includes a first node. One or more modules including a condition extraction module that is stored at least partially in memory and includes or functions in tandem with a computer processor may determine at least one precondition and at least one harmless condition for the first node. One or more X-behavior properties may be generated for the first node at least by combining the at least one precondition and the at least one harmless condition.

In some of these second embodiments where the first node is an internal node of the at least the portion of the electronic design, the at least one first precondition for the first node may be determined at least by performing one or more first analyses on first logic driving the first node. In addition, the at least one first harmless condition may be determined for the first node at least by performing one or more analyses on second logic driven by the first node when the first node is the internal node for the at least the portion of the electronic design.

In some other embodiments where the first node is an output node of the least the portion of the electronic design, the at least one first precondition for the first node may be determined at least by performing one or more analyses on logic driving the first node. In addition, the at least one first harmless condition may be identified when the first node is the output node for the at least the portion of the electronic design. The at least one first harmless condition may be provided by a user in some embodiments or may be identified by pattern matching including, for example, name matching or string matching in some other embodiments. In one embodiment, the at least one first harmless condition may be identified without performing structural or functional analyses on the logic or circuit component designs driven by the first node.

In some embodiments where the first node is an input node of the least the portion of the electronic design, the at least one first harmless condition for the first node may be determined at least by performing one or more analyses on logic driven by the first node. In addition, the at least one first precondition may be identified when the first node is the input node for the at least the portion of the electronic design. The at least one first precondition may be provided by a user in some embodiments or may be identified by pattern matching including, for example, name matching or string matching in some other embodiments. In one embodiment, the at least one first precondition may be identified without performing structural or functional analyses on the logic or circuit component designs driving the first node.

In addition or in the alternative, a second node may be identified in the at least the portion of the electronic design, wherein the second node is driving or driven by the first node. The one or more modules including the condition extraction module may determine at least one second precondition and at least one second harmless condition for the second node based in part or in whole upon the at least one first precondition, the at least one first harmless condition, or both the at least one first precondition and the at least one first harmless condition for the first node. One or more second X-behavior properties may be generated for the second node at least by combining the at least one second precondition and the at least one second harmless condition.

In some of these embodiments where the second node is an input node of the at least the portion of the electronic design (hence the first node will be driven by the second node), the at least one second precondition may be identified for the second node when the second node is an input node for the at least the portion of the electronic design. The at least one second precondition may be provided by a user in some embodiments or may be identified by pattern matching including, for example, name matching or string matching in some other embodiments. In one embodiment, the at least one first precondition may be identified without performing structural or functional analyses on the logic or circuit component designs driving the first node. The at least one second harmless condition may also be determined for the second node at least by performing one or more second analyses on logic driven by the second node when the second node is the input node for the at least the portion of the electronic design.

In some other embodiments where the second node is an internal node of the at least a portion of the electronic design, the at least one second precondition may be determined for the second node at least by performing one or more first analyses on first logic driving the second node when the second node is an internal node for the at least the portion of the electronic design; and the at least one second harmless condition may be determined for the second node at least by performing one or more second analyses on second logic driven by the second node when the second node is the internal node for the at least the portion of the electronic design.

In other embodiments where the second node is an output node of the at least the portion of the electronic design (and hence the first node is driving the second node), the at least one second harmless condition may be identified for the second node when the second node is an output node for the at least the portion of the electronic design. The at least one second harmless condition may be provided by a user in some embodiments or may be identified by pattern matching including, for example, name matching or string matching in some other embodiments. In one embodiment, the at least one second harmless condition may be identified without performing structural or functional analyses on the logic or circuit design components driven by the second node. The at least one second precondition may be determined for the second node at least by performing one or more analyses on logic driving the second node when the second node is the output node for the at least the portion of the electronic design.

In some embodiments, a second node may be identified in the at least the portion of the electronic design, where the first node is an internal node, and the second node is an output node of the at least the portion of the electronic design. In addition, an input precondition for the input node may be identified. The input precondition may be provided by a user in some embodiments or may be identified by pattern matching including, for example, name matching or string matching in some other embodiments. In one embodiment, the input precondition may be identified without performing structural or functional analyses on the logic or circuit component designs driving the second node. Formal verification may be performed for the first node by using at least the input precondition for the input node as an assumption in the formal verification for the first node.

In some of these immediately preceding embodiments, an output harmless condition may be identified for the second node. The output harmless condition may be provided by a user in some embodiments or may be identified by pattern matching including, for example, name matching or string matching in some other embodiments. In one embodiment, the output harmless condition may be identified without performing structural or functional analyses on the logic or circuit component designs driven by the second node. An output precondition may be determined for the second node at least by performing one or more analyses on logic driving the second node. In addition, the formal verification for the second node may be performed by using at least the output harmless condition for the second node, the output precondition for the second node, and results of the formal verification for the first node.

Some embodiments are directed at an article of manufacture that includes a non-transitory machine-accessible storage medium having stored thereupon a sequence of instructions which, when executed by at least one micro-processor or at least one processor core, causes the at least one micro-processor or the at least one processor core to perform any of the methods, processes, or sub-processes disclosed herein. Some illustrative forms of the non-transitory machine-readable storage media may also be found in the System Architecture Overview section below.

More details of various aspects of the methods, systems, or articles of manufacture for implementing coplanar waveguide transmission lines in an electronic design are described below with reference to FIGS. 1-6.

BRIEF DESCRIPTION OF THE DRAWINGS

The drawings illustrate the design and utility of various embodiments of the invention. It should be noted that the figures are not drawn to scale and that elements of similar structures or functions are represented by like reference numerals throughout the figures. In order to better appreciate how to obtain the above-recited and other advantages and objects of various embodiments of the invention, a more detailed description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which:

FIGS. 5L-P illustrate some examples of portions of electronic design and their respective extracted preconditions or harmless conditions using some techniques described herein in some embodiments.

DETAILED DESCRIPTION

Figure 1:
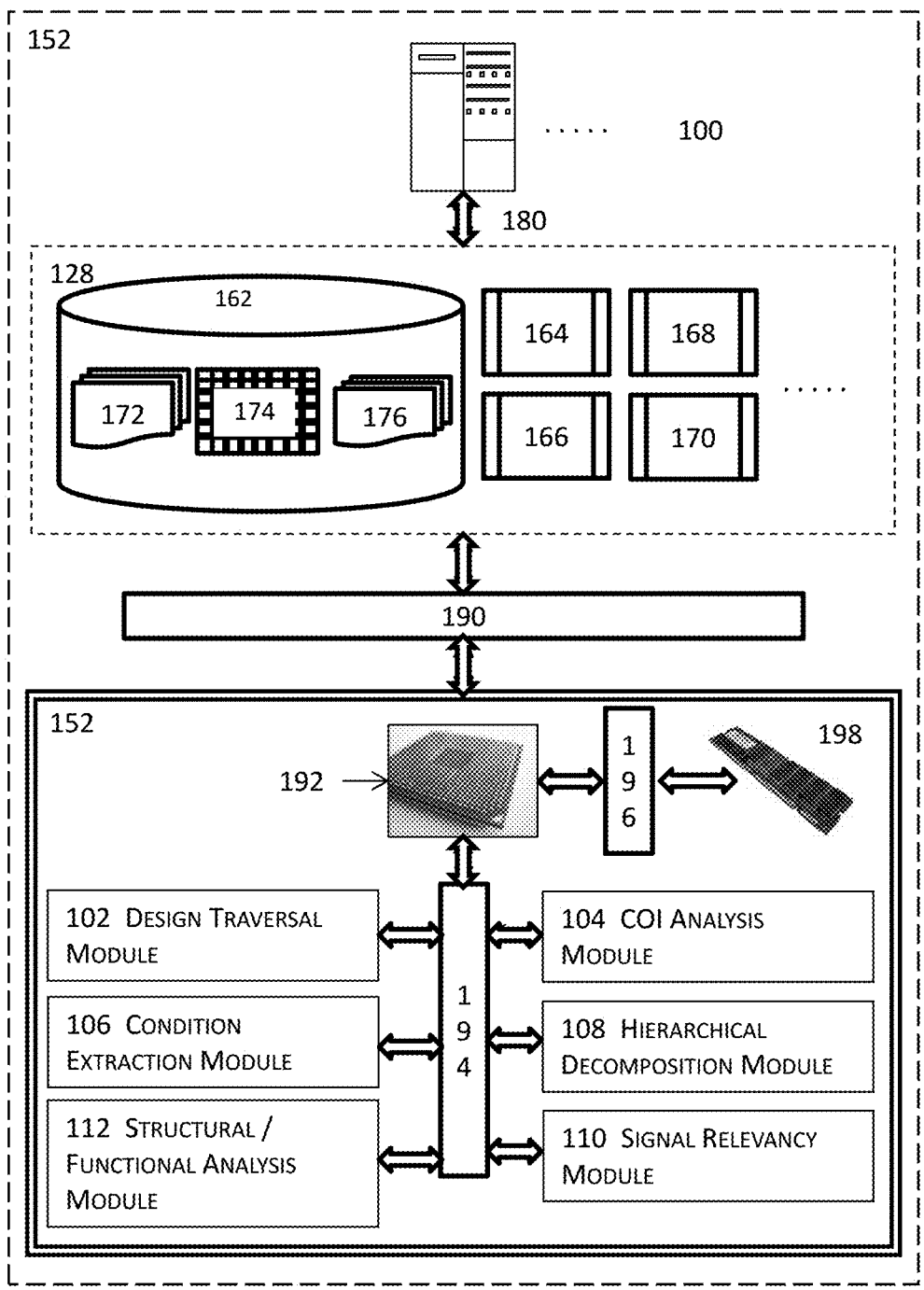
FIG. 1 illustrates a high level schematic block diagram for verifying X-behavior in an electronic design in one or more embodiments.

Various embodiments are directed to a method, system, and computer program product for X-behavior verification of an electronic design. Other objects, features, and advantages of the invention are described in the detailed description, figures, and claims.

In various embodiments, the input node, the output node, and one or more internal nodes of interest in an electronic design or a portion thereof may be identified for X-behavior verification. The electronic design or the portion thereof may be decomposed or partitioned into smaller, respective portions. Various techniques described herein selectively elaborate and analyze these respective, smaller portions of the electronic design to extract one or more preconditions and/or harmless conditions for one or more nodes. The electronic design or the portion thereof may then be proved hierarchically with the extracted one or more preconditions or harmless conditions.

For example, the precondition and the harmless condition may be extracted by analyzing respective portions of the electronic design for an internal node. X-propagation may then be proved for the internal node with the extracted precondition and extracted harmless condition. The input portion of the electronic design or the portion thereof may be optionally analyzed to generate the optional harmless condition for the input node. Similarly, the output portion of the electronic design or the portion thereof may also be optionally analyzed to generate the optional precondition for the output node. The optional harmless condition or the optional precondition, when generated, may be used to assist the capturing, extraction, and proof of X-behavior for an internal node. When the X-behavior proof for an internal node is complete, the proof result may be assumed for the internal node during the proof of X-propagation another node such as the output node.

A precondition for a node includes a condition that, when true, indicates the occurrence of X (unknown) will not propagate from the input of the node to the node. Since this allows Xs when the precondition is false, a property with a precondition is more likely to be verified to be true than a property without a precondition. A harmless condition for a node includes a condition that, when true, indicates the occurrence of X (unknown) at the node will not propagate to the fanout of the node. Since this occurrence of X at the node cannot be propagated to a location that should not have X, it is therefore harmless.

Various embodiments of the methods, systems, and articles of manufacture will now be described in detail with reference to the drawings, which are provided as illustrative examples of the invention so as to enable those skilled in the art to practice the invention. Notably, the figures and the examples below are not meant to limit the scope of various embodiments, unless otherwise specifically described in particular embodiment(s) or recited in the claim(s).

Where certain elements of embodiments may be partially or fully implemented using known components (or methods or processes), portions of such known components (or methods or processes) that are necessary for an understanding of the present invention will be described, and the detailed descriptions of other portions of such known components (or methods or processes) will be omitted for ease of explanation and to not obscure embodiments of the invention. Further, embodiments encompass present and future known equivalents to the components referred to herein by way of illustration. More details about various processes or modules to implement various embodiments are further described below with reference to FIGS. 1-5.

FIG. 1 illustrates a high level schematic block diagrams for verifying X-behavior in an electronic design in one or more embodiments. More specifically, FIG. 1 illustrates an illustrative high level schematic block diagrams for implementing trace warping for electronic designs and may comprise one or more computing systems 100, such as a general purpose computer described in the System Architecture Overview section to implement one or more special proposes.

In some embodiments, the one or more computing systems 100 may invoke various system resources such as the processor(s) or processor core(s), memory, disks, etc. The one or more computing systems 100 may also initiate or interact with other computing systems to access, via a computer bus architecture (e.g., a system bus, a control bus, a data bus, or any combinations thereof), various resources 128 that may comprise a floorplanner, a global routing engine, and/or a detail routing engine 164, a layout editor 166, a design rule checker 168, a verification engine 170, etc. The verification engine 170 may perform formal verification tasks in some embodiments.

The one or more computing systems 100 may further write to and read from a local or remote non-transitory computer accessible storage 162 that stores thereupon data or information such as, but not limited to, one or more databases (174) such as schematic design database(s) or physical design database(s), electronic circuit design specification database(s), various statistics, various data, rule decks, various design rules, constraints, etc. (172), or other information or data (176) that may be used to facilitate the performance of various functions to achieve the intended purposes.

In some embodiments, the one or more computing systems 100 may include or, either directly or indirectly through the various resources 128, invoke a set of modules 152 including hardware modules and software modules or combinations of one or more hardware modules and one or more software modules. Each of these modules may include or function in tandem with electrical circuitry and one or more micro-processors each having one or more processor cores to perform its intended functions.

The hardware system may further include one or more forms of non-transitory machine-readable storage media or persistent storage devices to temporarily or persistently store various types of data or information, various design rules, various libraries, selected and selectable targets, or any other suitable information or data, etc. A module is initialized in a computing system so that the software portion of the module is stored in memory (e.g., random access memory) to be executed by one or more processors or processor cores off the computing system to perform at least a part of the functionality of the module. Some illustrative modules or components of the hardware system may be found in the System Architecture Overview section below.

The set of modules 152 may comprise a design traversal module 102 to determine the extent of traversal and to traverse an electronic design or a portion thereof (e.g., a RTL or functional description of the electronic design or the portion, a graphical representation of the electronic design or the portion, a schematic design of the electronic design or the portion, or any other representation of the electronic design or the portion, etc.) The set of modules 152 may also include a cone of influence (COI) module 104 to identify and/or determine a cone of influence of a target signal and to perform one or more cone of influence analyses to identify relevant signals for the target signal.

The set of modules 152 may further optionally include a condition extract module 106 to extract one or more preconditions for a signal and/or one or more harmless conditions for a signal with respect to X-propagation verification. For example, the condition extraction module 106 may extract a precondition for a signal so that when the precondition is true, a signal at the node does not or cannot have the unknown state (X) in some embodiments. As another example, the condition extraction module 106 may extract a harmless condition for a signal so that when the harmless condition is true, the unknown state (X) in the fanin of the signal will not propagate to the fanout of the signal so that the unknown state (X) is harmless.

In addition or in the alternative, the set of modules 152 may include a hierarchical decomposition module 108 to partition a more complex electronic design or a portion thereof into smaller portions. The hierarchical decomposition module 108 may further function in conjunction with one or more modules (e.g., the condition extraction module 106, the signal relevancy module 110, the COI analysis module 104, etc.) to partition an electronic design or a portion thereof hierarchically into smaller portions, to extract locally for the smaller portions, and to perform X-propagation verification hierarchically for the electronic design or the portion thereof. In some embodiments, the hierarchical decomposition module 108 may also perform one or more comparisons between a precondition and a harmless condition for a node for X-propagation verification for the node without performing formal verification tasks for X-propagation for the node.

The set of modules 152 may include a signal relevancy module 110 that functions in tandem with, for example, the design traversal module 102 and/or the COI analysis module 104 to identify one or more relevant signals, and/or a structural and/or functional analysis module 112 to perform one or more structural analyses, one or more functional analyses, or any combinations thereof on an electronic design or a portion thereof.

In some embodiments, the computing system 100 may include the various resources 128 such that these various resources may be invoked from within the computing system via a computer bus 180 (e.g., a data bus interfacing a microprocessor 192 and the non-transitory computer accessible storage medium 198 or a system bus 190 between a microprocessor 192 and one or more engines in the various resources 128). In some other embodiments, some or all of these various resources may be located remotely from the computing system 100 such that the computing system may access the some or all of these resources via a computer bus 180 and one or more network components.

The set of modules 152 may further optionally include one or more signoff modules (not shown) to perform various signoff and design closure tasks. For example, the one or more signoff modules may include one or more timing signoff modules to perform timing analyses and timing closure related tasks (e.g., silicon-accurate timing signoff, signal integrity analyses, etc.) to ensure an electronic design meets power, performance, or other requirements before tapeout, one or more signoff parasitic extraction modules to provide silicon-accurate interconnect parasitic extraction and ensure first-pass silicon success, and one or more power signoff modules to perform various power integrity analyses, transistor-level electro-migration and IR-drop analyses, or other power and signal integrity analyses with SPICE-level or better accuracy to ensure an electronic design meets or exceeds power, performance, and/or area goals in some embodiments.

The computing system may also include one or more modules in the set of modules 152. One or more modules in the set 152 may include or at least function in tandem with a microprocessor 192 via a computer bus 194 in some embodiments. In these embodiments, a single microprocessor 192 may be included in and thus shared among more than one module even when the computing system 100 includes only one microprocessor 192. A microprocessor 192 may further access some non-transitory memory 198 (e.g., random access memory or RAM) via a system bus 196 to read and/or write data during the microprocessor's execution of processes.

Figure 2:
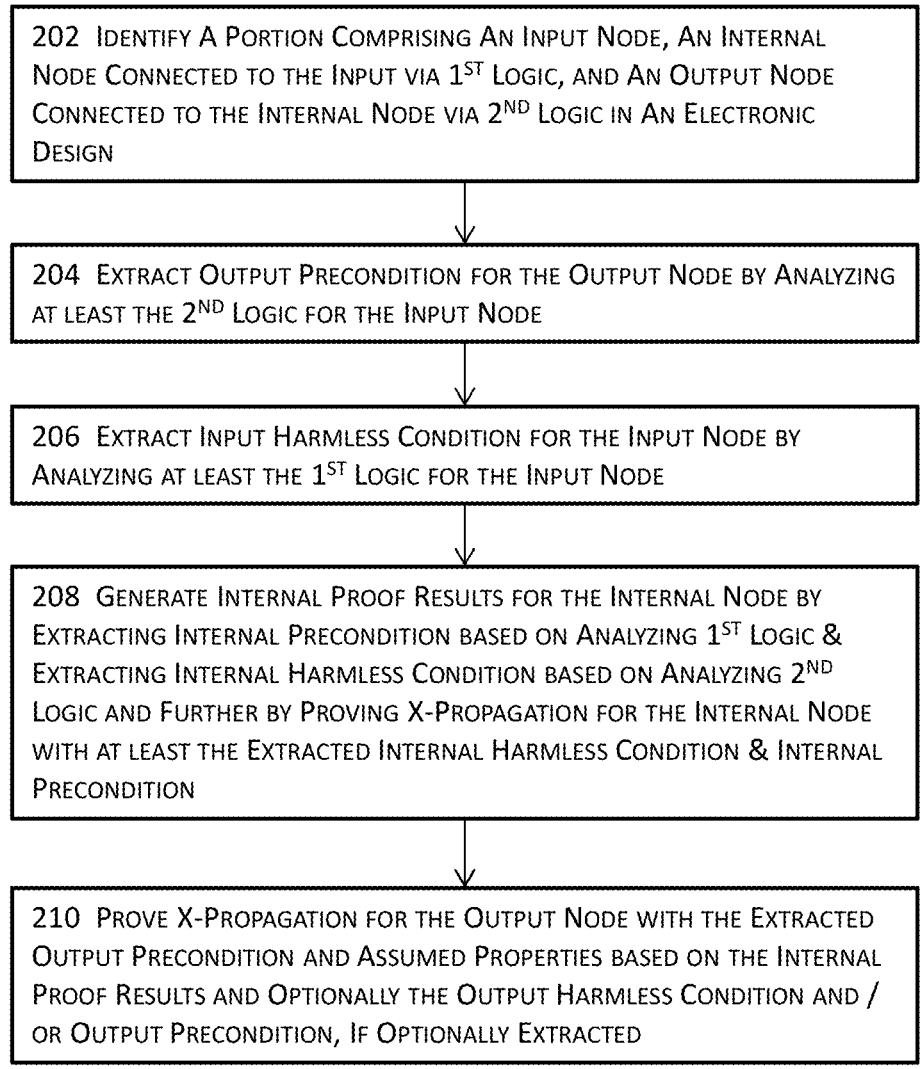
FIG. 2 illustrates a high block diagram for verifying X-behavior in an electronic design in one or more embodiments.

FIG. 2 illustrates a high-level block diagram for X-behavior verification of an electronic design in one or more embodiments. A portion of an electronic design may be identified at 202. The portion may include, for example, a net or a net segment and thus may comprise an input node, an output node, and one more internal nodes of interest between the input node and the output node. For the simplicity and ease of description, various examples described herein will include one internal node between the input node and output node. Nonetheless, it shall be noted that various techniques described herein apply with full and equal effects to an electronic design or a portion thereof comprising more than one internal node between the input node and the output node. The portion of the electronic design identified at 202 may further include a first logic connecting the input node and an internal node as well as a second logic connecting the internal node and the output node.

Figure 4A:
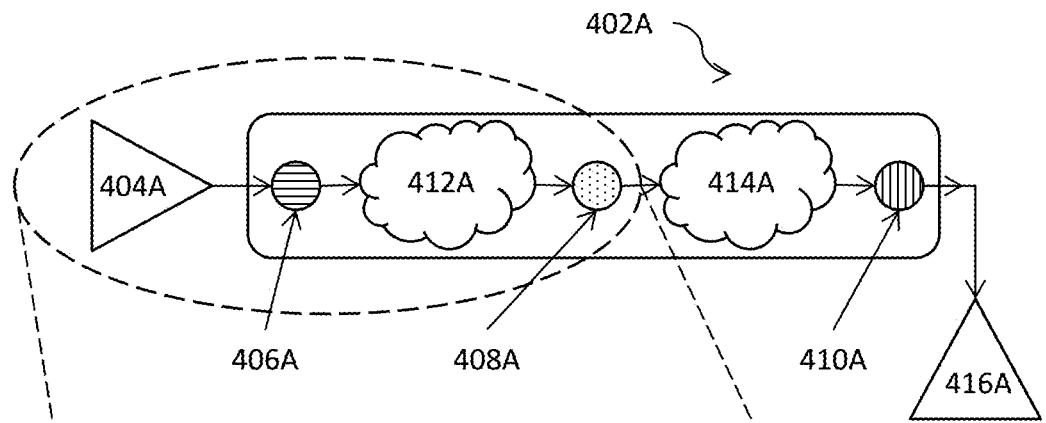
FIGS. 4A-C jointly illustrate an example of a portion of an electronic design to which various techniques for verifying X-behavior in an electronic design may be applied in one or more embodiments.

In the example illustrated in FIG. 4A, a portion of an electronic design 402A includes an input node 406A, an internal node 408A, and first logic 412A connecting the input node 406A and the internal node 408A. The portion of the electronic design 402A further includes an output node 410A and second logic 414A connecting the output node 410A and the internal node 408A. The portion of the electronic design 402A may also be optionally associated with an input precondition 404A in some embodiments. An optional output harmless condition 416A may also be optionally provided for the output node 410A in some embodiments.

An output precondition may be optionally extracted at 204 for the output node at least by analyzing the second logic or a portion thereof. It shall be noted that the analysis for and the extraction of the output precondition is entirely optional and does not affect the accuracy of various techniques described herein. Nonetheless, the output precondition, when available, may be used to reduce the search space for further proof of the electronic design. Hence, the availability of such preconditions may thus reduce the memory footprint of the search space as well as the runtime to prove the electronic design or the portion thereof. In this application, the terms "proof" and "verification" as well as "prove" and "verify" may be used interchangeably. In the example illustrated in FIGS. 4A-C, the output precondition 406C may be optionally extracted by analyzing the second logic 414A or a portion thereof. In some embodiments, an output harmless condition 416A may also be optionally specified or provided by, for example, a user (or an electronic design automation tool with the pattern matching functionality).

In various embodiments, a precondition of a node (input, output, and internal node) is automatically generated by various modules described herein to specify a condition that, when true, a signal at the node does not or cannot have the unknown state (X). In some of these embodiments, a precondition includes the negation of a condition that, when true, a signal at the node may have the unknown state (X). In these embodiments, the precondition specifies the circumstances under which a signal may have the unknown state (X). An example of a precondition from an internal node or an output node may be specified in the following example illustrated in FIG. 5L that illustrates precondition extraction by inference through backward traversal of a portion of an electronic design where the extraction level is to the next flop:

assign a_d1=(disable1)?1'bx: b_d1;
    always_ff@(posedge clk)
        a_q1<=a_d1;

In the aforementioned example, the target signal to prove X-behavior is a_q1 and the property is !$isunknown(a_q1). The signal a_q1 is assigned the value from a_d1; and a_d1 receives its value from the internal x source 1'bx when disable1 has the value of "1" (one). When disable1 has the values of "0" (zero), a_d1 receives its value from b_d1. Therefore, various techniques may automatically extract the precondition as "disable1" because when this precondition is false, a_q1 definitely will have value X. As a result, the property is modified into "~disable1|→!$isunknown (a_q1)". Verification of the original property will always fail with this logic, but verification of the revised property may pass, depending on the logic driving b_d1.

Another example of a precondition may be specified in the following example, that also illustrates precondition extraction by inference through traversal of a portion of an electronic design where extraction level up to the next control flop is combined with an analysis of whether any x-source exists in a fanin cone of influence of a signal.

assign a_d2=(select2) ? b_d2: c_d2;
    always_ff@(posedge clk)
      a_q2<=a_d2;

In the aforementioned example, the target signal to prove X-behavior is a_q2 and the property is !$isunknown(a_q2). The signal a_q2 is assigned the value from a_d2; and a_d2 receives its value from b_d2 when select2 has the value of "1" (one). When select2 has the values of "0" (zero), a_d2 receives its value from c_d2. An analysis on the fanin cone of influence of b_d2 may show that some x-sources exist within the cone of influence of b_d2, and an analysis on the fanin cone of influence of c_d2 may show that no x-sources exists within the cone of influence of c_d2. Therefore, various techniques may automatically extract the precondition as "~select2" because when this precondition is true, a_q2 is receiving its value from c_d2 and definitely will not receive the value X. As a result, the property is modified into "~select2|→!$isunknown(a_q1)". Verification of the original property may fail with this logic, depending on the logic driving b_d2, but verification of the revised property will always pass.

Another example of a precondition may be specified in the following example illustrated in FIG. 5M that illustrates precondition extraction by name or string matching, rather than by design traversal:

input [7:0] DmxPdmC_Req1FlitData;
    input DmxPdMC_Req1FiltData_Valid;

In this example illustrated in FIG. 5M, various techniques may analyze when the unknown state (X) may occur in the data. When the name of a one-bit signal (input, output, or internal node) is the same as the name of a multi-bit signal except for a postfix, it is likely that the two signals are related. Pattern matching on postfixes (either standard postfix such as "_valid", "_vld", or as provided by the user) will allow an analysis to infer related preconditions for the user. When the value of "DmxPdmC_Req1FlitData_Valid" is "1" (one), the input data "DmxPdmC_Req1FlitData" may have some value that needs to be analyzed. In this example, various techniques may automatically extract the precondition as "DmxPdmC_Req1FlitData_Valid" for the signal DmxPdMC_Req1FlitData" and revise the x property as "DmxPdmC_Req1FlitData_Valid|→!$isunknown (DmxPdmC_Req1FlitData)". In the case where the extracted precondition is true (e.g., when DmxPdmC_Req1FlitData_Valid does have the value of "1") the data at DmxPdMC_Req1FiltData should not have an unknown state (X).

In some embodiments, an input harmless condition for the input node may also be optionally extracted at 206 at least by analyzing the first logic for the input node. A harmless condition for a node includes a condition that, when true, indicates the occurrence of X (unknown) at the node will not propagate to the fanout of the node and is thus harmless. Although the extraction of the input harmless condition is entirely optionally, the input harmless condition, when optionally extracted, may also be used, as the optional output precondition, to reduce the search space for further proof of the electronic design.

In various embodiments, a harmless condition of a node (input, output, and internal node) is automatically generated by various modules described herein to specify a condition that, when true, indicates the occurrence of X (unknown) at the node will not propagate to the fanout of the node and is thus harmless. In some of these embodiments, a harmless condition includes the negation of a condition that, when true, a signal at the node may have a harmful unknown state (X). An example of a precondition from an internal node or an input node may be specified in the following example that illustrates a harmless condition extraction by inference through forward traversal of a portion of an electronic design where the extraction level is to the next flop:

assign c_d3=(select3) ? a_d3: b_d3;
    always_ff@(posedge clk)
      c_q3<=c_d3;

In the aforementioned example, the target signal to prove X-behavior is a_d3 and the property is !$isunknown(a_d3). The signal c_q3 is assigned the value from c_d3; and c_d3 receives its value from a_d3 when select3 has the value of "1" (one). When select3 has the values of "0" (zero), c_d3 receives its value from b_d3. If a_d3 is not driving any other signal, an unknown value at a_d3 is not harmful unless it propagates to c_q3. Therefore, various techniques may automatically extract the harmless condition as "~select3" because when this precondition is true, c_q3 is receiving its value from b_d3 and will not receive the value X from a_d3. As a result, the property is modified into "select3|→!$isunknown(a_q3)" using the negation of the harmless condition—there is no need to verify that a_q3 does not have value X when select3 is false because the design will work correctly in such situation. Verification of the original property may fail with this design, but verification of the revised property will be less likely to fail.

Another example of a harmless condition may be specified in the following example that illustrates harmless condition extraction by name or string matching, rather than by design traversal:

output [7:0] DmxPdmC_Req2FlitData;
    output DmxPdMC_Req2FiltData_Valid;

In this example, various techniques may analyze when the unknown state (X) may occur in the data. When the name of a one-bit signal (input, output, or internal node) is the same as the name of a multi-bit signal except for a postfix, it is likely that the two signals are related. Pattern matching on postfixes (either standard postfix such as "_valid", "_vld", or as provided by the user) will allow an analysis to infer related harmless conditions for the user. When the value of "DmxPdmC_Req2FlitData_Valid" is "1" (one), the input data "DmxPdmC_Req2FlitData" may have some value that needs to be analyzed. In this example, various techniques may automatically extract the harmless condition as "~DmxPdmC_Req2FlitData_Valid" for the signal DmxPdMC_Req2FlitData" and revise the x property as "DmxPdmC_Req2FlitData_Valid|→!$isunknown (DmxPdmC_Req2FlitData)". In the case where the extracted harmless condition is true (e.g., when DmxPdmC_Req2FlitData_Valid does have the value of "1") it is ok for the data at DmxPdMC_Req2FiltData to have an unknown state (X).

For example, the verification engine may exclude the cases where the input harmless condition (and/or the output precondition) is true from the search space during the verification of the electronic design for X-propagation verification. Hence, the availability of such input harmless conditions may thus reduce the memory footprint of the search space as well as the runtime to prove the electronic design or the portion thereof. In the example illustrated in FIGS. 4A-C, an input harmless condition 404B (see FIG. 4B) may be optionally extracted at least by analyzing the first logic 412A or a portion thereof. In some embodiments, the input precondition 404A may also be optionally provided or specified by a user or through pattern matching.

Internal proof results may be generated for the internal node in the electronic design or the portion thereof at 208 at least by extracting the internal precondition for the internal node based in part or in whole upon analyzing the first logic located between the internal node and the input node. For example, the verification engine or module may perform a structural analysis, a functional analysis, name or string matching, inference by design traversal, or any combinations thereof on the first logic to extract the internal precondition for the internal node. In addition, the internal proof results may also be generated for the internal node by further extracting the internal harmless condition for the internal node at 208. A harmless condition for the internal node includes a condition that, when true, indicates that the occurrence of X (unknown) on the input side of the internal node will not propagate to the fanout of the internal node and is thus harmless. Given an internal node sig, combining the precondition "pre" based in part or in whole upon analyzing the first logic and the harmless condition "hl" based in part or in whole upon analyzing the second logic, the property "pre & !hl|→$isunknown(sig)" is used for verification analysis, instead of $isunknown(sig).

With the extracted internal precondition and internal harmless condition, verification of the X-propagation for the internal node may be performed at 208 to generate the internal proof results at least by using the extracted internal precondition and the extracted internal harmless condition for the internal node. In some embodiments, verification of the X-propagation for the internal node may be performed by comparing the internal precondition to the internal harmless condition to generate the internal proof results. For example, the content of the internal precondition may be compared to that of the internal harmless condition to prove or disprove whether an unknown state (X) may occur on the input side of the internal node as well as whether the unknown state (X), when occurred, may be propagated to the output side of internal node in these embodiments. In the aforementioned example, if the expression "pre & !hl" can be determined to be always false, it would implies that the property "pre & !hl|→$isunknown(sig)" is true without further analysis of the design, in part or in whole. If "pre & !hl" is not always false, verification of the property would only return failure when "pre & !hl" is true, This avoids the user wasted effort in debug a failure where "pre & !hl" is false, since such failures with "pre & !hl" being false indicates the unknown value X in sig is not affecting the correctness of the design.

Figure 4B:
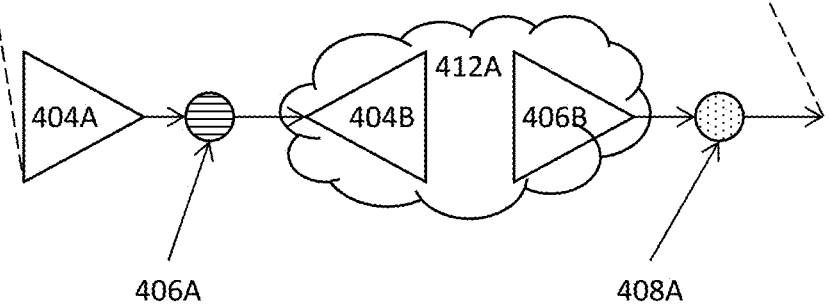

In the example illustrated in FIG. 4B, the internal precondition 406B for the internal node 408A may be extracted at least by analyzing the first logic 412A or a portion thereof. In the example illustrated in FIG. 4C, the internal harmless condition 404C may be extracted at least by analyzing the second logic 414A or a portion thereof. The extent of analysis for the extraction may depend on, for example, whether a full cone of influence or a partial cone of influence is to be analyzed. For example, the extent of precondition analysis may perform a structural analysis on the fanin cone of the internal node up to the next control flop or control register in some embodiments or to two or more levels of control flops or control registers in some other embodiments. Similar operations may be performed for the fanout cone of influence for the harmless condition extraction.

In extracting the internal precondition 406B for the internal node 408A, the first logic 412A or a portion thereof may be elaborated and analyzed, while the remainder of the electronic design or the portion identified (e.g., at 202) may remain un-elaborated in some embodiments. In some of these embodiments, because the first logic 412A is already elaborated, the input harmless condition 404B may also be extracted to aid the verification of X-propagation even though the input harmless condition 404B is entirely optional. Once the extraction of the internal precondition 406B is done, the memory used to store the elaborated first logic 412A may be freed up.

Figure 4C:
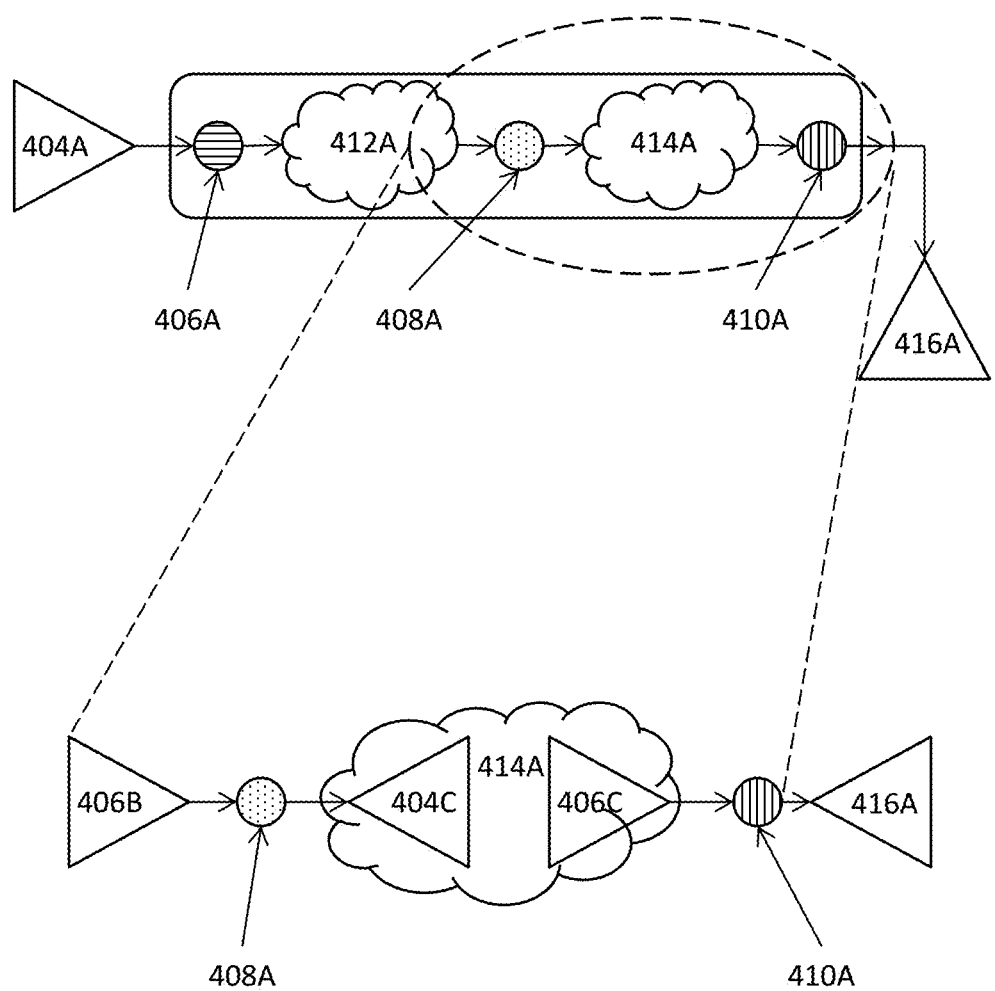

In the example illustrated in FIG. 4C, the internal harmless condition 404C may be extracted at least by analyzing the second logic 414A. In extracting the internal harmless condition 404C for the internal node 408A, the second logic 414A may be elaborated and analyzed, while the remainder of the electronic design or the portion identified (e.g., at 202) may remain un-elaborated in some embodiments. In some of these embodiments, because the second logic 414A is already elaborated, the output precondition 406C may also be optionally extracted to aid the verification of X-propagation.

Once the extraction of the internal harmless condition 404C is done, the memory used to store the elaborated second logic 414A may be freed up. With the extracted internal precondition 406B and the extracted internal harmless condition 404C, X-propagation verification may be performed, using the modified property containing precondition and harmless condition, for the internal node to generate the internal proof results for the internal node 408A. The generated internal proof results may be assumed for the internal node for the proof of the output node 410A by using, for example, Assume Property in Verilog Hardware Description Language. There is no proof for the input node 406A, however, because node 406A is an input node and thus no proof is needed at least for the portion illustrated in FIGS. 4A-C. The input node 406A may nevertheless be receiving and thus subject to control of other control or logic components (not shown in FIGS. 4A-C) in some embodiments. In these embodiments, additional proof for the input node 406A is nevertheless beyond the scope of the description of FIGS. 4A-C but may be performed by using various techniques described herein.

Verification or proof of X-behavior propagation may then be performed at 210 for the output node with at least the extracted output precondition and assumed property (or properties) based in part in whole upon the internal proof results for the internal node. In some embodiments where the optional output precondition and/or the optional output harmless condition for the output node is also identified (e.g., specified or provided by a user), the verification or proof of X-behavior propagation may then be performed at 210 for the output node further with the optional output harmless condition and/or the optional output precondition for the output node. As described above, although the output precondition and the output harmless condition are entirely optional, these optional output precondition and output harmless condition, when optionally extracted, may be used to reduce the search space during the verification of X-propagation, and hence the memory footprint, runtime, and other computing resources (e.g., computing resources related to inputs and outputs, network accesses, etc.) may be reduced due to the smaller search space for various verification tasks.

In the examples illustrated in FIGS. 4A-C, X-propagation verification for the output node 410A may be finally proved or disproved by using the assumed property or properties for the internal node 408A. In some embodiments, X-propagation verification for the output node 410A may be optionally proved or disproved further by using the optionally extracted output precondition 406C, if available. In addition or in the alternative, X-propagation verification for the output node 410A may be proved or disproved by further using the output harmless condition 416A, if available.

FIGS. 3A-D jointly illustrate a more detailed block diagram for verifying X-behavior in an electronic design in one or more embodiments. An electronic design or a portion thereof at a first hierarchy, a first instance of a cell at a second hierarchy immediately below the first hierarchy, and a second instance of the cell or a different cell at the second hierarchy may be identified at 302. The first instance and the second instance may be instantiated from the same cell master in some embodiments or from different cell masters in some other embodiments.

Figure 5A:
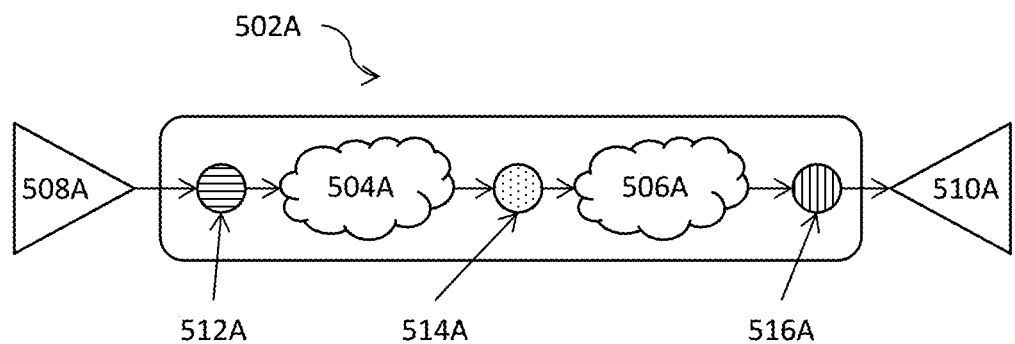
FIGS. 5A-E jointly illustrate an example of a portion of an electronic design to which various techniques for verifying X-behavior in an electronic design may be applied in one or more embodiments.
Figure 5B:
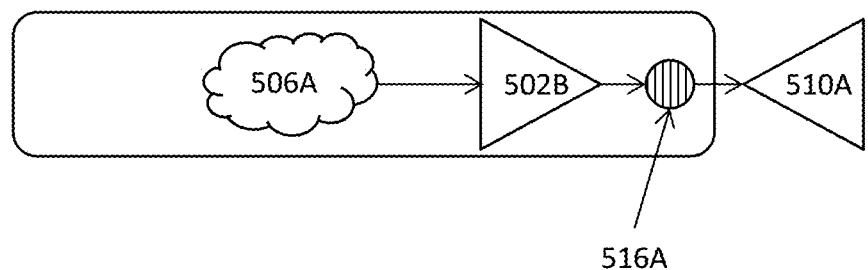
Figure 5C:
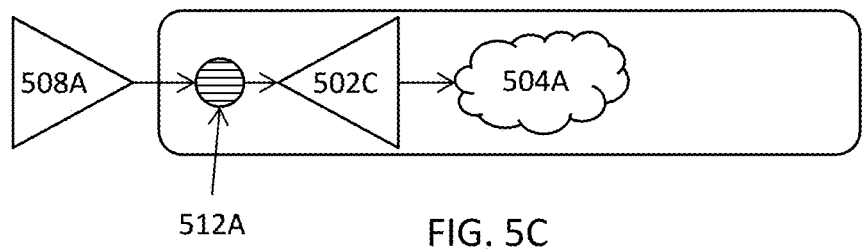
Figure 5D:
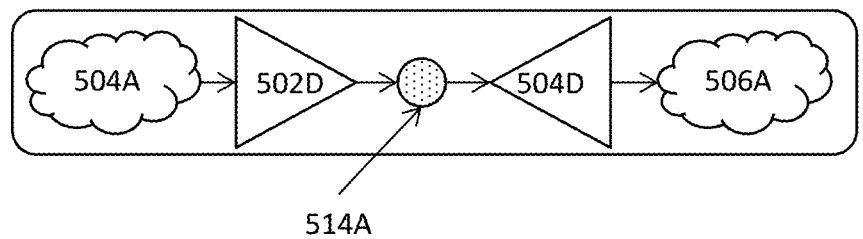
Figure 5E:
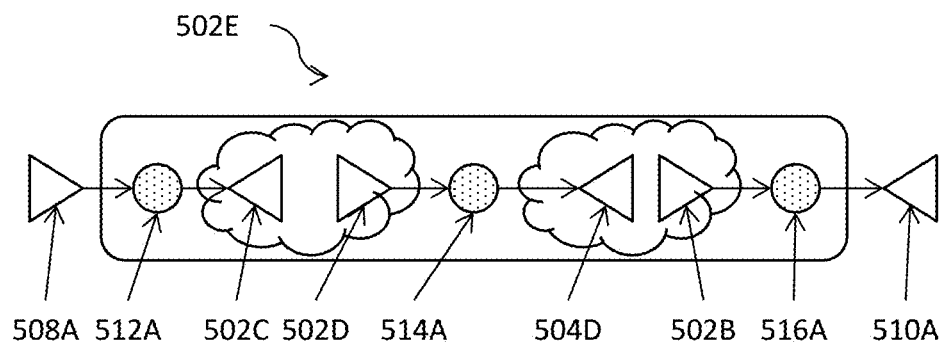
Figure 5F:
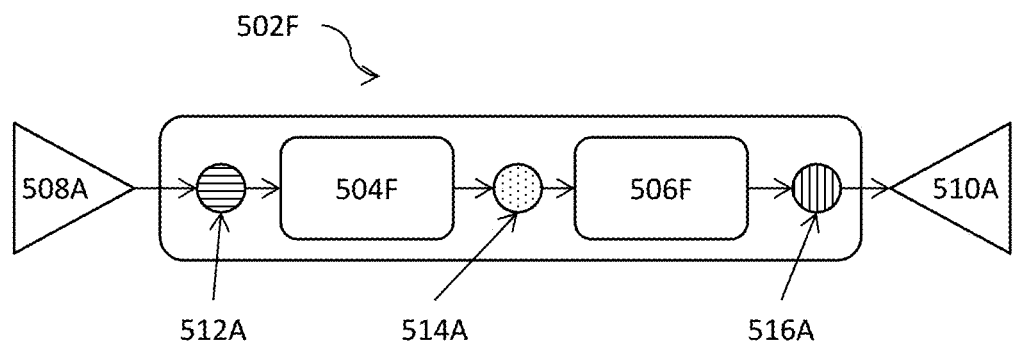
FIGS. 5F-J jointly illustrate another example of a portion of an electronic design to which various techniques for verifying X-behavior in an electronic design may be applied in one or more embodiments.
Figure 5G:
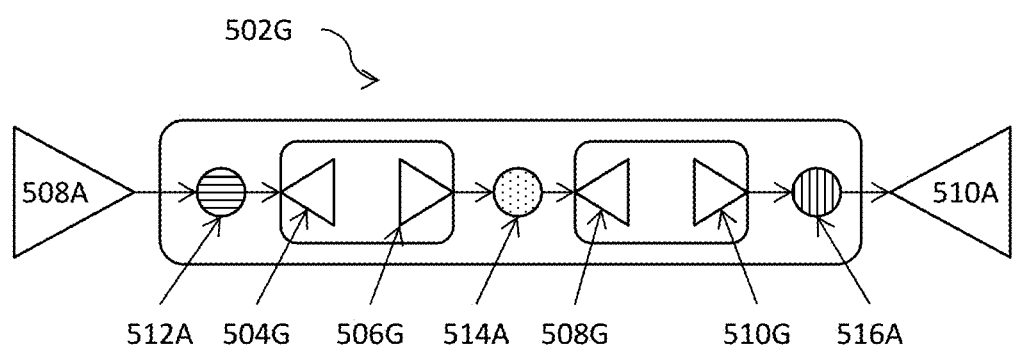
Figure 5H:
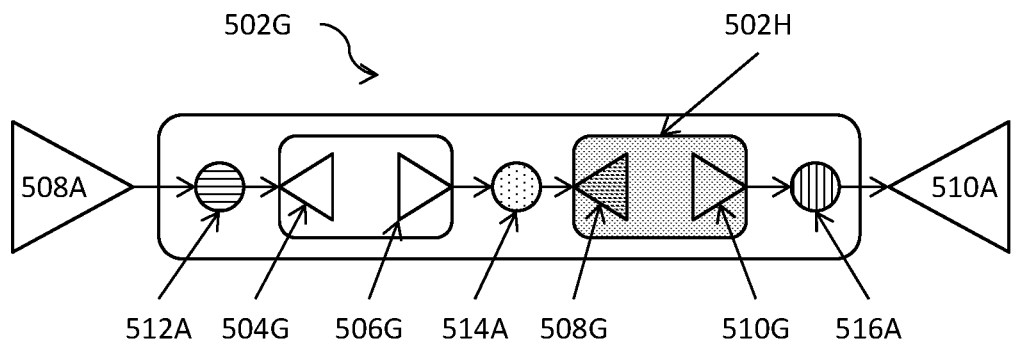
Figure 5I:
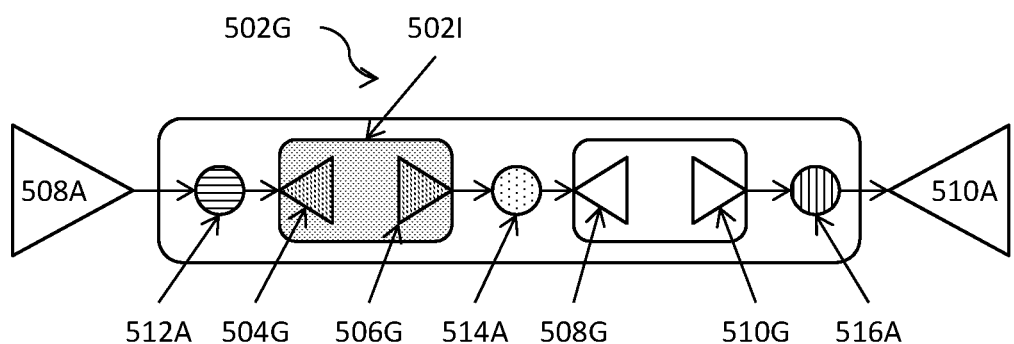
Figure 5P:
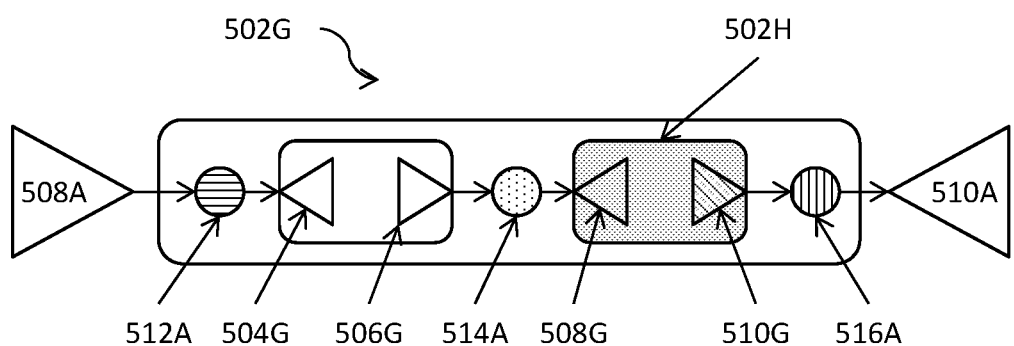
Figure 5J:
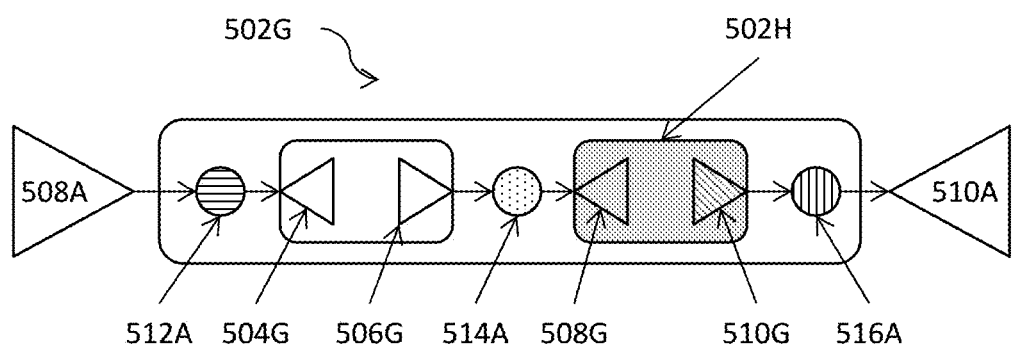

In the example illustrated in FIG. 5F, the electronic design includes a portion 502F at the first hierarchy, a first instance 504F at the second hierarchy immediately below the first hierarchy, and a second instance 506F also at the second hierarchy. The first hierarchy at which the portion 502F is located includes the second hierarchy at which the first instance 504F and the second instance 506F are located as well as the input node 512A, the internal node 514A, and the output node 516A. FIG. 5F also illustrates the input precondition 508A and the output harmless condition 510A, both of which are optional yet are provided in this example.

Hierarchical decomposition or hierarchical proof decomposition may be performed at 304 for the first hierarchy at least by identifying an input node, an output node, and an internal node. A hierarchical decomposition hierarchical decomposes a larger design into smaller portions, analyzes, proves, or disproves at least one of the smaller portions, and uses the results of analyzing, proving, or disproving the at least one smaller portion to assist the proof, disproof, or verification of the larger design. The internal node is contained in the portion at the first hierarchy and is located between the first instance and the second instance at the second hierarchy. In the example illustrated in FIGS. 4A-C, hierarchical decomposition may analyze the first logic 412A to obtain the analysis results for the input node 406A, use the analysis result for the input node 406A to analyze, prove, or disprove the internal node 408A, and then use the results for the internal node 408A to help verify, prove, or disprove the X-propagation for the output node 410A.

In the example illustrated in FIG. 5F, the internal node 514A is located between the first instance 504F and the second instance 506F. In this example, hierarchical decomposition may be performed to analyze, prove, or disprove the first instance 504F to determine the relations between the input node 512A and the internal node 514A. Hierarchical decomposition may further analyze, prove, or disprove the second instance 506F to determine the relations between the internal node 514A and the output 516A. The results of analyzing both the first instance 504F and the second instance 506F may then be used to perform X-verification to determine how signals at the input node 512A affect the output node 516A.

Hierarchical decomposition may be optionally performed at 306 for the second hierarchy in some embodiments where the second hierarchy includes one or more third hierarchies below the second hierarchy. For example, if the first instance 504F at the second hierarchy includes a plurality of instances of cells at the third hierarchy, hierarchy proof decomposition may be performed to decompose the proof or disproof of the first instance 504F into proof or disproof of smaller portions and use the proof or disproof results for one or more of these smaller portions to assist the proof or disproof of the first instance by using techniques similarly described above.

An input precondition may be optionally identified at 308 for the input node. In addition or in the alternative, an output harmless condition may be optionally identified at 308. As described above, the input precondition and the output harmless condition are optional and may be provided or specified by the user. These optional input precondition and optional output harmless condition, when optionally provided, may be used to reduce the search space during the verification of the portion of the electronic design identified at 302 and thus may reduce the memory footprint occupied by the search space as well as the runtime to prove or disprove the electronic design or the portion thereof.

Figure 3A:
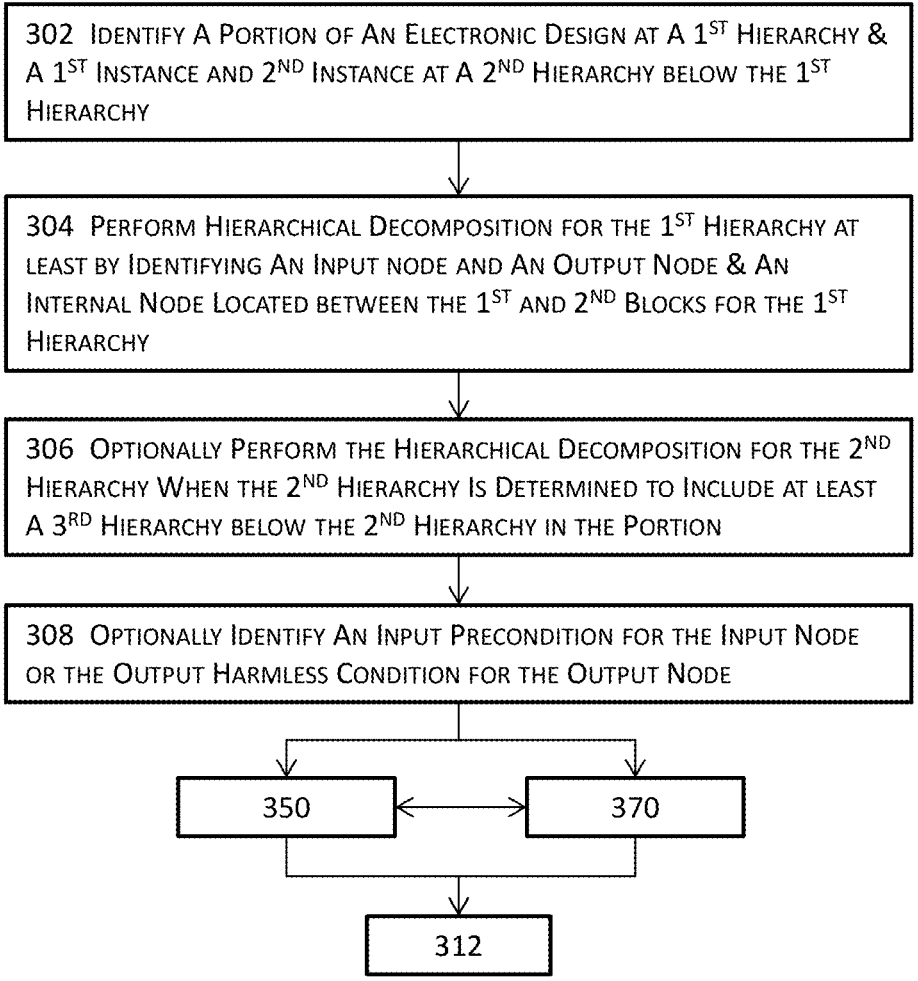
FIGS. 3A-D jointly illustrate a more detailed block diagram for verifying X-behavior in an electronic design in one or more embodiments.
Figure 3B:
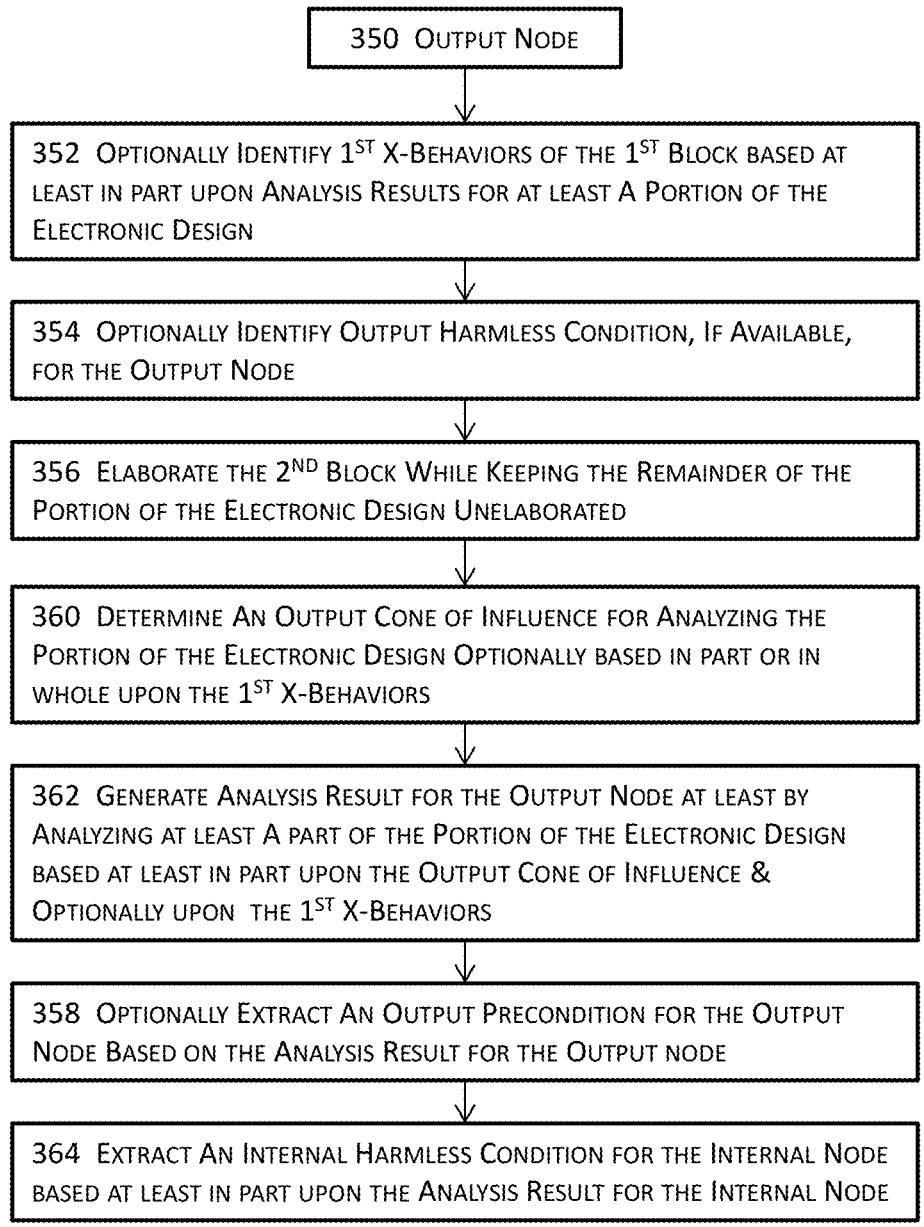
Figure 3C:
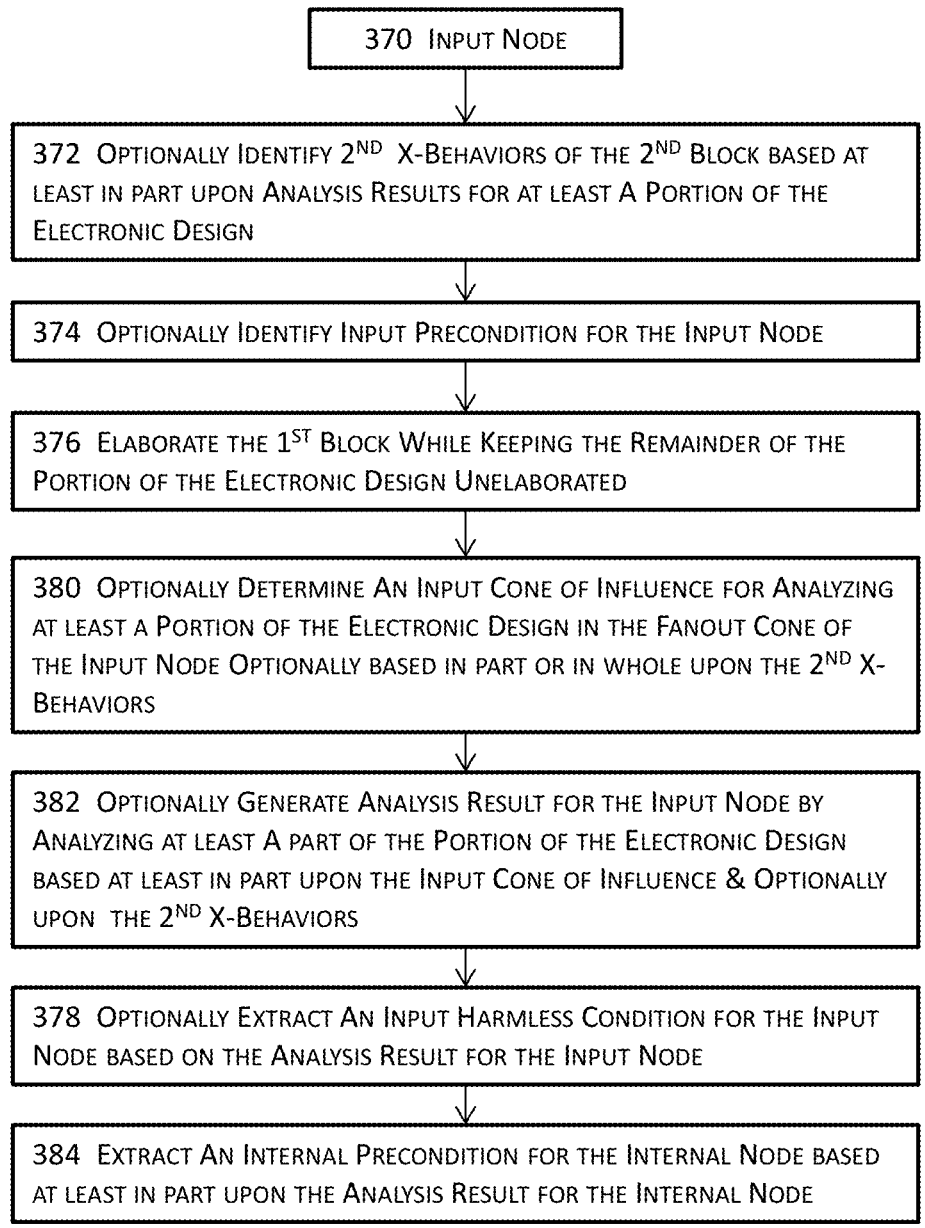
Figure 3D:
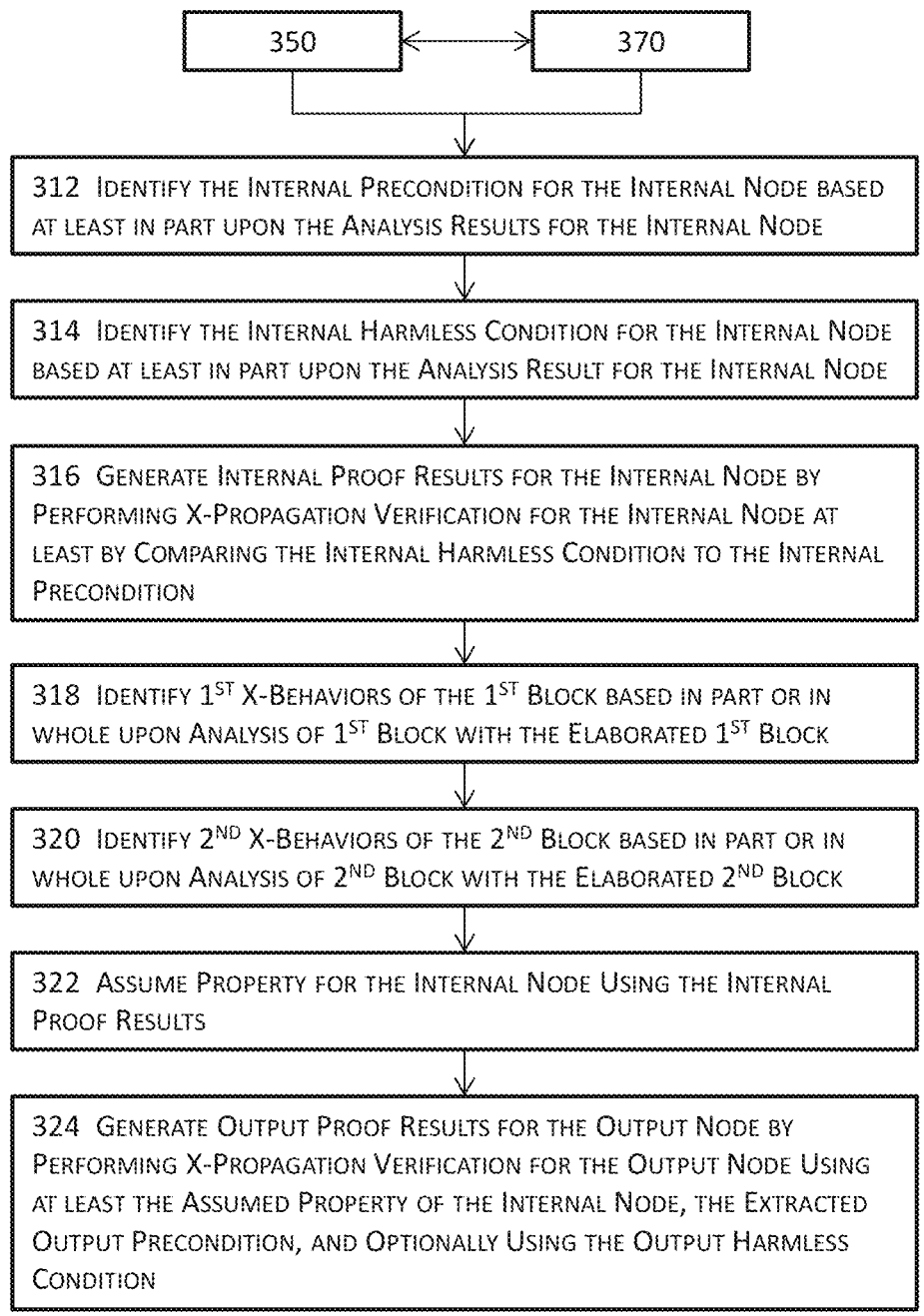

The block diagram illustrated in FIG. 3A then bifurcates into flow 350 and flow 370. The order of performance of the flow starting at 350 for the output node and the flow starting at 370 for the input node does not affect the ultimate outcome of the verification of the portion of the electronic design identified at 302. In other words, the process may, after 308, first proceed to 350 and then to 370 in some embodiments or may first proceed to 370 and then to 350 in some other embodiments while achieving the same results. In alternate embodiment, flow 350 and flow 370 may be performed in parallel, using multicore machines or multiple machines.

At 350, various analyses may be performed for the output node of the portion of the electronic design identified at 302. The first X-behaviors of the first block or logic located between the input node and the internal node may be optionally identified in FIG. 3C, performed before or in parallel with FIG. 3B in part or in whole upon analysis results for at least a portion of the electronic design. In the example illustrated in FIG. 5A, the first X-behaviors for the first block or logic 504A located between the input node 512A and the internal node 514A may be optionally determined or identified at 370 to 384 by elaborating the first block or logic 504A or a portion thereof and further by performing structural and/or functional analyses.

This optional identification of X-behaviors of the first block arises due to the order of performance in the flow starting at 350 for the output node and the flow starting at 370 for the input node. For example, if the flow starting at 370 is performed first to determine the first X-behaviors prior to the performance of the flow starting at 350, the first X-behaviors for the first block (e.g., the first block or logic 504A in FIGS. 5A-E or the first instance 504F in FIGS. 5F-J) may be identified for the flow 350 described here.

The output harmless condition, if available, may be optionally identified at 354. The second block may be elaborated at 356 while keeping the remainder of the portion of the electronic design identified at 302 unelaborated. In the example illustrated in FIG. 5P, the shade first instance 502H represents an elaborated second instance, whereas the other unshaded instances represent unelaborated portions of the electronic design. In the example illustrated in FIG. 5A, the output harmless condition 510A, if available, may be optionally identified at 354. This output harmless condition may be used to assist the X-propagation verification to reduce the search space as described above. The data for the elaborated second block remains in memory until the extraction of one or more conditions are complete. Once the extraction of these one or more conditions is complete, the data for the elaborated second block may be optionally removed from memory to reduce memory utilization.

An output-precondition cone of influence including relevant circuit components in the fanin cone of the output node may be determined at 358 for analyzing the portion of the electronic design of interest identified at 302. This output-precondition cone of influence may be used to determine the extent of analysis for the extraction of the output precondition. For example, the output-preconfidition cone of influence may be determined to include the circuit components up to the next control register or the next control flop in some embodiments. The output-precondition cone of influence may be determined to be the full cone of influence including all the circuit components that may affect the signal value at the output node in some embodiments or a partial cone of influence excluding one or more circuit components that may affect the signal value at the output node in some other embodiments.

A full cone of influence includes all the circuit components that may affect the value of the signal at a node. Therefore, the analysis based on a full cone of influence may guarantee a condition (e.g., a precondition, a harmless condition, etc.) or the X-behavior for the node when the condition is true. In contrast, a partial cone of influence includes only a smaller set of circuit components that may affect the signal value at a node while excluding one or more other circuit components in the partial cone of influence. Therefore, a condition extracted based on a partial cone of influence may not guarantee the X-behavior or the extracted condition for the node when the condition is true because a circuit component excluded from the partial cone of influence may nevertheless affect the signal value of the node and hence the X-behavior at the node. In some embodiments, the output-precondition cone of influence of the output node may be determined based in part or in whole upon the first X-behaviors of the first block located between the input node and the internal node.

One or more structural analyses may be performed on at least a portion in the fanin cone of the output node based in part or in whole upon the determined output-precondition cone of influence to generate analysis results at 358 for the output node. In some of these embodiments, the analysis results may also be generated based optionally in part upon the first X-behaviors, if available, of the first block located between the input node and the internal node. In the example illustrated in FIGS. 5A-E, at least a portion of the second block 506A may be analyzed based on a determined cone of influence for the output node 516A to extract the output precondition 502B for the output node 516A.

An output precondition may be optionally extracted at 358 for the output node. The output precondition of the output node is extracted by various modules described herein to specify a condition that, when true, a signal at the output node does not or cannot have the unknown state (X). The output precondition for the output node may be optional in some embodiments in that the output precondition is not necessarily required for the X-propagation verification for the portion of the electronic design of interest. The output precondition, when optionally extracted, may also be used to reduce the search space during the X-propagation verification and hence reduce the memory footprint occupied by the search space as well as the runtime needed for the X-propagation verification. In the example illustrated in FIGS. 5A-E, the output precondition 502B may be optionally extracted for the output node 516A. In some embodiments, the output precondition may be extracted based in part or in whole upon analysis results of analyzing at least a part of the second block 506A, and the part of the second block analyzed may be determined based in part or in whole upon the determined cone of influence in the fanin cone of the output node.

In some embodiments where the output precondition is not extracted, various structural analyses and/or functional analyses on the logic elements in the fanin cone of the output node may be performed to determine the X-behaviors of these logic elements in the fanin cone of the output node, without the aid of the output precondition although these embodiments may need longer runtime and larger memory footprint in comparison with the embodiments where the output precondition is extracted. Therefore, the extraction of the output precondition is entirely optional. In the example illustrated in FIG. 5B, the output precondition 502B may be extracted for the output node 516A by, for example, analyzing the second logic 506A located between the output node 516A and the internal node 514A in the portion 502A of the electronic design of interest.

The second block located between the output node and the internal node may have been elaborated at 356 for the optional extraction of the output precondition for the output node at 358. In some of these embodiments, the internal harmless condition may also be extracted at 364 for the internal node. Due to the availability of the elaborated second block of the portion of the electronic design such that the second block need not be elaborated again for the extraction of the internal harmless condition. In some of these embodiments where the internal precondition of the internal node are available from the analysis of the first X-behaviors of the first block, the internal harmless condition may also be generated based in part or in whole upon the internal precondition or the first X-behaviors of the first block.

The internal harmless condition for the internal node may be extracted by performing one or more analyses on a portion of the second block based in part or in whole upon the cone of influence in the fanout cone of the internal node in some embodiments. This cone of influence may be a full cone in some embodiments or a partial cone in some other embodiments and may be used to determine the extent of the one or more analyses for the extraction of the internal harmless condition.

In the example illustrated in FIGS. 5A-E, at least a portion of the second block 506A may be analyzed based on a determined cone of influence for the internal node 514A to extract the internal harmless condition 504D for the output node 514A when the second block 506A or a portion thereof is elaborated. The output precondition 502B may also be extracted by analyzing the second block 506A or a portion thereof when the second block 506A or a portion thereof is elaborated. In the example illustrated in FIGS. 5F-H, when the second instance 506F is elaborated as shown by the shaded 502H in FIG. 5H while the remainder of the portion 502G remains unelaborated, the output precondition 510G may be extracted for the output node 516A based in part or in whole upon the analysis results of at least a part of the second instance 506F; and the internal harmless condition 508G may also be extracted for the internal node 514A based in part or in whole upon the analysis results of at least a part of the second instance 506F.

In various embodiments, an elaborated portion of an electronic design may be removed from memory to further reduce memory footprint once the desired or required conditions (e.g., a precondition, a harmless condition, etc.) are extracted and the desired x-behavior verification pertaining to such elaborated portion is done.

Referring back to FIG. 3C, various analyses may be performed at 370 for the input node of the portion of the electronic design identified at 302. The second X-behaviors of the second block or logic located between the internal node and the output node may be optionally identified at 372 based in part or in whole upon analysis results for at least a portion of the electronic design. In the example illustrated in FIGS. 5A-F, the second X-behaviors for the second block or logic 506A located between the internal node 514A and the output node 516A may be optionally determined or identified in FIG. 3B, performed before or in parallel with FIG. 3C by elaborating the second block or logic 506A or a portion thereof and further by performing structural and/or functional analyses.

This optional identification of the second X-behaviors of the second block arises due to the order of performance in the flow starting at 350 for the output node and the flow starting at 370 for the input node. For example, if the flow starting at 350 is performed first to determine the first X-behaviors prior to the performance of the flow starting at 370 for the input node, the second X-behaviors for the second block (e.g., the second block or logic 506A in FIGS. 5A-E or the second instance 506F in FIGS. 5F-J) may be identified for the flow 370 described here.

An input precondition, if available, may be optionally identified at 374 for the input node in some embodiments. In the example illustrated in FIGS. 4A-C, the input precondition 404A may be identified at 374 for the input node 406A. In the example illustrated in FIGS. 5A-E, the input precondition 508A may be identified at 374 for the input node 512A. In the example illustrated in FIGS. 5F-5K, the input precondition 508A may be identified at 374 for the input node 512A. The input precondition is entirely optional and, when available for identification, may be identified and used to reduce the search space and hence the memory footprint and runtime during the X-propagation verification as described above.

The first block located between the input node and the internal node may be elaborated at 376 while the remainder of the portion of the electronic design identified at 302 remains unelaborated. In the example illustrated in FIGS. 5A-E, the first block 504A may be elaborated at 376 while the remainder of the portion of the electronic design remains unelaborated. In the example illustrated in FIG. 5I, the shade first instance 502I represents an elaborated first instance, whereas the other unshaded instances represent unelaborated portions of the electronic design. The data for the elaborated first block remains in memory until the extraction of one or more conditions are complete. Once the extraction of these one or more conditions is complete, the data for the elaborated first block may be optionally removed from memory to reduce memory utilization.

An input-harmless-condition cone of influence may be determined at 378 for analyzing at least a portion of the electronic design in the fanout cone of the input node. In some embodiments, the input-harmless-condition cone of influence for the input node may be determined based optionally upon the second X-behavior of second block in the portion of the electronic design. The input-harmless-condition cone of influence may be subsequently used in extracting the input harmless condition for the input node. The input-harmless cone of influence may include a full cone of influence that includes all the relevant circuit components in the fanout cone of the input node in some embodiments or a partial cone of influence that includes some but not all the relevant circuit components in the fanout cone of the input node. A relevant circuit component for a node includes the circuit component that may affect the signal value at the node.

The input-harmless-condition cone of influence may be used to determine the extent of the analysis to be performed for the input node. For example, the input-harmless-condition cone of influence may be determined to include relevant circuit components in the fanout cone of the input node up to the next control register, the next control flop, etc. in some embodiments. In the example illustrated in FIGS. 4A-C, an input cone of influence for the input node 406A may be determined by analyzing at least a portion of the first logic 412A. In the example illustrated in FIGS. 5A-E, an input cone of influence for the input node 512A may be determined by analyzing at least a portion of the first block 504A. In the example illustrated in FIGS. 5F-J, an input cone of influence for the input node 512A may be determined by analyzing at least a portion of the first instance 504F or 502I.

Analysis results may be generated at 378 for the input node by performing one or more analyses (e.g., one or more structural analyses, one or more functional analyses, or any combinations of one or more structural and one or more functional analyses) on at least a portion of the electronic design in the fanout cone of the input node based in part or in whole upon the input-harmless condition cone of influence.

With the elaborated first block or first instance, an input harmless condition may be optionally extracted at 378 for the input node. In the example illustrated in FIGS. 5A-E, the input harmless condition 502C may be extracted for the input node 512A by elaborating the first block 504A and further by performing one or more analyses (e.g., one or more structural analyses) on the elaborated first block 504A or a portion thereof. In the example illustrated in FIGS. 5F-J, the input harmless condition 504G may be extracted for the input node 512A by elaborating the first instance 504F shown as the shaded 502I and further by perform one or more analyses (e.g., one or more structural analyses) on the elaborated first instance 504F or a portion thereof. With the elaborated first block (e.g., 504A) or the elaborated first instance (e.g., 504F or 502I), the internal precondition (e.g., 504D in FIG. 5D or 508G in FIG. 5G) may also be extracted.

Due to the availability of the elaborated first block or instance, an internal precondition may be extracted at 384 for the internal node based in part or in whole upon the analysis results for the internal node. In some embodiments, the internal precondition for the internal node may be extracted by first determining an internal cone of influence including relevant circuit components in the fanin cone of the internal node and further by analyzing at least the determined internal cone of influence for the extraction of the internal precondition. In the example illustrated in FIG. 4A-C, the internal precondition 406B may be extracted for the internal node 408A based in part or in whole upon the internal cone of influence. In the example illustrated in FIGS. 5A-E, the internal precondition 502D may be extracted for the internal node 514A based in part or in whole upon the internal cone of influence that may be used to determine the extent of analysis on the first block 504A. In the example illustrated in FIGS. 5F-J, the internal precondition 506G may be extracted for the internal node 514A based in part or in whole upon the internal cone of influence that may be used to determine the extent of analysis on the first instance 504F or 502I.

Once the flows starting at 350 and 370 are complete, both the internal precondition (e.g., 406B in FIGS. 4A-C, 502D in FIGS. 5A-E, and 506G in FIGS. 5F-J) and the internal harmless condition (e.g., 404C in FIGS. 4A-C, 504D in FIGS. 5A-E, and 508G in FIGS. 5F-J) are extracted for the internal node (e.g., 408A in FIGS. 4A-C and 514A in FIGS. 5A-J). The process illustrated in FIGS. 3A-D may proceed to 312 to identify the internal precondition for the internal node. The internal harmless condition may also be identified at 314 for the internal node. The identified precondition and harmless condition is then used to create a property capturing the x-behavior of the internal node. In some embodiments, the property is captured as "(pre & !hl)|→$isunknown(sig)", with "pre" being the precondition, "hl" being the harmless condition, and "sig" being the name of the internal node. This property will be used in 316 to generate the internal proof results for the internal node, and will be used in 322 as an assumption to generate the output proof results for the output node.

In some embodiments, all the preconditions other than an internal precondition of an internal node are optional; and all the harmless conditions other than an internal harmless condition are also optional, but these preconditions and harmless conditions may be useful for making 316 and 322 more efficient. For example, both the output precondition and the input harmless condition may be optional in these embodiments, and the same results may nevertheless be achieved by performing one or more analyses (e.g., performing one or more structural and/or functional analyses on demand or on the fly) on the pertinent portions of the electronic design of interest rather than by extracting these optional preconditions and/or optional harmless conditions during the respective elaboration of respective portions of the electronic design of interest.

Internal proof results may be generated at 316 for the internal node at least by performing X-propagation verification for the internal node. In some embodiments, performing X-propagation verification may be performed by comparing the internal precondition to the internal harmless condition, rather than or instead of performing formal verification tasks with formal engines. In other embodiments, formal verification analyzing the property at the internal node identified from 312 and 314 may verify the first X-behaviors of the first block or instance based in part or in whole analysis of the first block or a portion thereof with the elaborated first block located between the input node and the internal node. During such formal analysis, the identified precondition and harmless condition for the input node is used to create a property capturing the x-behavior of the input node. In some embodiments, the property is captured as "(pre & !hl)|→$isunknown(sig)", with "pre" being the precondition, "hl" being the harmless condition, and "sig" being the name of the input node. The property at the input node is used as an assumption for the formal verification of the property at the internal node.

The internal proof results may then be used to assume one or more properties at 322 for the internal node. These one or more assumed properties for the internal node may then be used in performing X-propagation verification for the output node at 324. Similar to the internal node, the identified precondition and harmless condition for the output node is used to create a property capturing the x-behavior of the output node. In some embodiments, the property is captured as "(pre & !hl)|→~$isunknown(sig)", with "pre" being the precondition, "hl" being the harmless condition, and "sig" being the name of the output node. In some embodiments where the output harmless condition is also available, the X-propagation verification for the output node may be performed by comparing the output precondition to or with the output harmless condition, rather than or instead of performing formal verification tasks for the output node with a formal verification engine. In other embodiments, a formal analysis of the property at the output node may verify the second X-behaviors of the second block or instance based in part or in whole analysis of the second block or instance or a portion thereof with the elaborated second block located between the internal node and the output node, using the property at the internal node as an assumption.

In these embodiments illustrated in FIGS. 4A-C and FIGS. 5A-J, verification of a complex portion of an electronic design is decomposed into smaller portions—the smaller portion associated with the input node, the smaller portion associated with the internal node, and the smaller portion associated with the output node. X-propagation verification is then separately performed on these smaller portions by extracting at least the internal precondition and the internal harmless condition to generate intermediate proof results that are then used to assist the X-propagation verification of other portion(s) of the overall, more complex portion of the electronic design. Various techniques described herein thus partition the X-propagation verification hierarchically, extract various conditions (e.g., preconditions, harmless conditions, etc.) locally, and prove an electronic design or a portion thereof hierarchical by using multiple elaborations.

In the example illustrated in FIGS. 5A-E, the internal precondition 502D and the internal harmless condition 504D may be extracted for the internal node 514A in the portion 502E of the electronic design, while the input precondition 508A, the input harmless condition 502C, the output harmless condition 510A, and the output precondition 502B may be optionally extracted for the input node and the output node, respectively.

It shall be noted that although both the input precondition 508A and the input harmless condition 502C may also be available in some embodiments, there is no proof required for the input node 512A of the portion 502E of the electronic design because the input node 512A is an input node receiving input signal(s). Nonetheless, the optional input precondition 508A and the optional input harmless condition 502C, when available, may be used to assist the analysis and X-propagation verification for the internal node 514A. The output precondition 502B may be optionally extracted for the output node 516A and may also be used, when extracted, for the X-propagation verification of the x-behavior at the output node, using the x-behavior of the internal node 514A.

The X-propagation may be proved or disproved for the internal node 514A by, for example, comparing the internal precondition 502D to or with the internal harmless condition 504D to generate the internal proof results for the internal node 514A. In some embodiments, the X-propagation verification for the internal node 514A may also be performed based optionally upon the optional precondition (e.g., the input precondition 508A) and/or the optional harmless condition (e.g., the input harmless condition 502C). The X-behaviors or various properties may then be assumed for the internal node 514A by using the internal proof results during the performance of X-propagation verification for the output node 516A. These assumed properties or X-behaviors for the internal node 514A may be used to assist the X-propagation verification for the output node 516A. In some embodiments, the X-propagation verification for the output node 516A may also be performed based optionally upon the optional precondition (e.g., the output precondition 502B) and/or the optional harmless condition (e.g., the output harmless condition 510A).

Figure 5K:
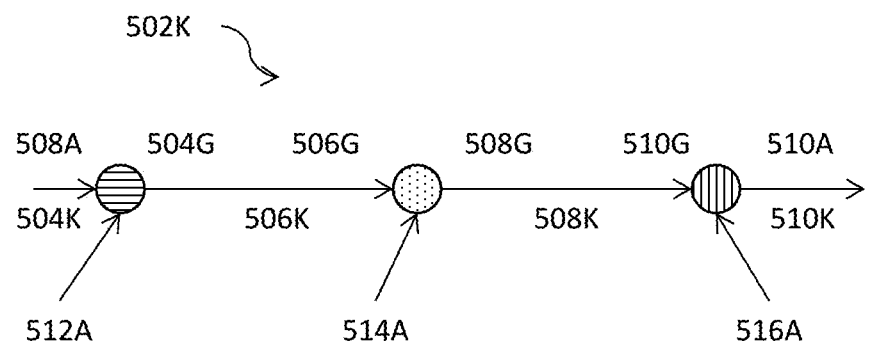
FIG. 5K illustrates an example of a graph-level specification for the portion of the electronic design illustrated in FIGS. 5A-J in one or more embodiments.

In some embodiments, the specification of the portion of the electronic design may be optionally represented as a graph-level specification. FIG. 5K illustrates an example of a graph-level specification for the portion of the electronic design illustrated in FIGS. 5F-J. More specifically, the graph-level specification 502K illustrated in FIG. 5K includes nodes relevant to X-propagation verification such as various registers, flops, etc. In the example illustrated in FIGS. 5A-J, the nodes of the graph-level specification include the internal node connected between the input node 512A and the output node 516A.

The graph-level specification 502K also includes a plurality of edges pointing into or output of the nodes in the graph-level specification and indicating signal paths into or out of these nodes. These edges may be associated with or annotated by the corresponding preconditions and harmless conditions. For example, edge 504K pointing into the input node 512A may be associated with or annotated by the input precondition 508A; edge 506K may be associated with or annotated by the input harmless condition 504G and the internal precondition 506G; edge 508K may be associated with or annotated by the internal harmless condition 508G and the output precondition 510G; and edge 510K may be associated with or annotated by the output harmless condition 510A, if the aforementioned preconditions and harmless conditions are available. One or more of these associated or annotated conditions may be manually modified, enabled, or disabled by the user.

In some embodiments, the precondition and harmless condition may be associated with the nodes instead of the edges. In some embodiments, the property of the form "(pre & !hl)|→$isunknown(sig)" may be displayed at a node.

In some embodiments, multiple internal nodes are analyzed; multiple input nodes are analyzed; or multiple output nodes are analyzed. In such embodiments, each edge may have precondition and harmless condition specific to the logic between the source and destination, and each node may list the precondition of the incoming edges or combine them into one precondition as conjunction of all preconditions. Each node may list the harmless condition of all outgoing edges or combine them into one harmless condition as conjunction of all harmless conditions.

In some embodiments where a condition is not available, the graph-level specification may still provide the placeholder in the graph-level specification to allow the generation or specification of the condition. For example, if the input precondition 508A is not available at the time the graph-level specification 502K is generated or extracted from the portion of the electronic design (e.g., an RTL or register transfer level design), the graph-level specification 502K may nevertheless include a placeholder in the graph-level specification to allow the user to specify or provide the input precondition 508A.

Similarly, if the output harmless condition 510A is not available at the time the graph-level specification 502K is generated or extracted from the portion of the electronic design, the graph-level specification 502K may nevertheless include a placeholder in the graph-level specification to allow the user to specify or provide the harmless condition 510A.

Also, if the input harmless condition 504G is not available at the time the graph-level specification 502K is generated or extracted from the portion of the electronic design, the graph-level specification 502K may nevertheless include a placeholder in the graph-level specification to allow the extraction of the input harmless condition 504G. The user may issue a command (e.g., by double clicking on the placeholder for the input harmless condition 504G) that in turn invokes an inter-process call to invoke the requisite modules to elaborate the relevant portion(s) of the electronic design, to perform pertinent analyses, and to extract the input harmless condition 504G in respond to the command issued by the user.

System Architecture Overview

Figure 6:
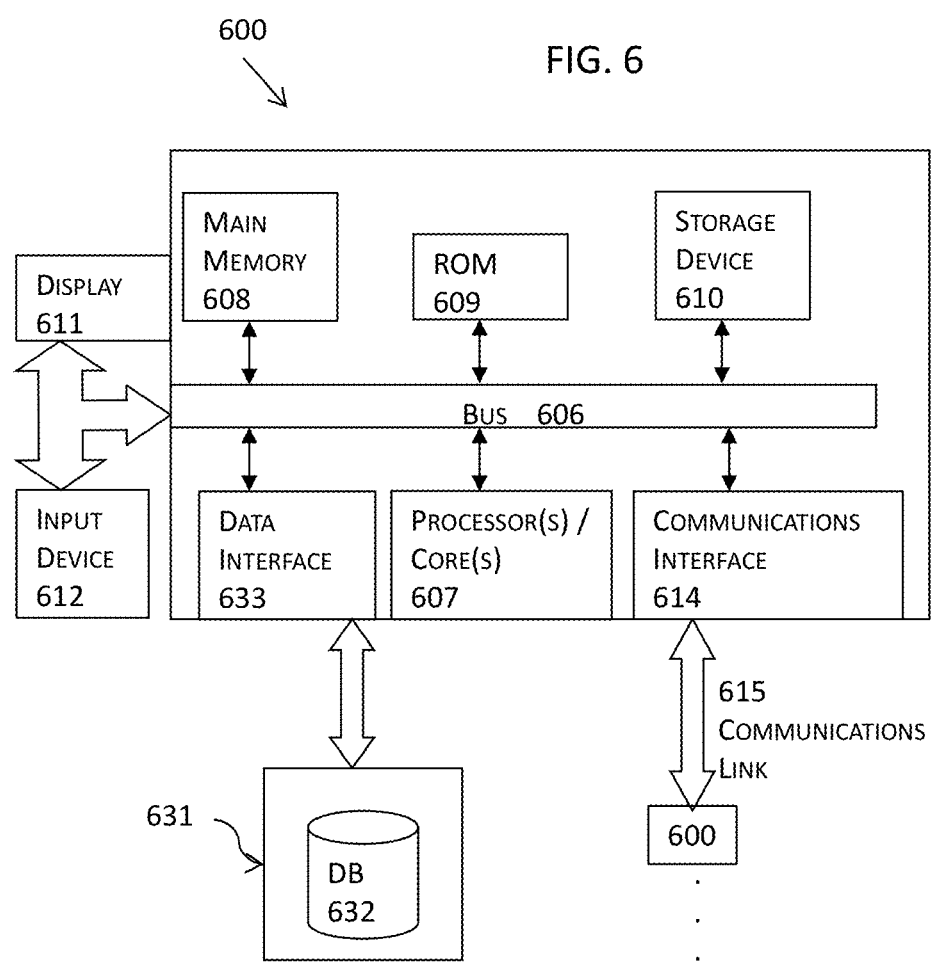
FIG. 6 illustrates a computerized system on which a method for verifying X-behavior in an electronic design may be implemented.

FIG. 6 illustrates a block diagram of an illustrative computing system 600 suitable for verifying X-behavior in an electronic design as described in the preceding paragraphs with reference to various figures. Computer system 600 includes a bus 606 or other communication module for communicating information, which interconnects subsystems and devices, such as processor 607, system memory 608 (e.g., RAM), static storage device 609 (e.g., ROM), disk drive 610 (e.g., magnetic or optical), communication interface 614 (e.g., modem or Ethernet card), display 611 (e.g., CRT or LCD), input device 612 (e.g., keyboard), and cursor control (not shown).

According to one embodiment, computing system 600 performs specific operations by one or more processor or processor cores 607 executing one or more sequences of one or more instructions contained in system memory 608. Such instructions may be read into system memory 608 from another computer readable/usable storage medium, such as static storage device 609 or disk drive 610. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

Various actions or processes as described in the preceding paragraphs may be performed by using one or more processors, one or more processor cores, or combination thereof 607, where the one or more processors, one or more processor cores, or combination thereof executes one or more threads. For example, various acts of determination, compression, decompression, etc. may be performed by one or more modules (e.g., one or more modules described in FIG. 1) including or functioning in tandem with one or more processors, one or more processor cores, or combination thereof.

A module described herein may also be implemented as a pure hardware module (e.g., a block of electronic circuit components, electrical circuitry, etc.) or a combination of a hardware module and a software block that jointly perform various tasks to achieve various functions or purposes described herein or equivalents thereof. For example, a module described herein may be implemented as an application-specific integrated circuit (ASIC) in some embodiments.

In these embodiments, a module may be stored at least partially in memory and may also include or function in tandem with, for example, a microprocessor or a processor core and other supportive electrical circuitry to perform specific functions which may be coded as software or hard coded as a part of an application-specific integrated circuit, ROM (read only memory), PROM (programmable read only memory), EPROM (erasable programmable read only memory), etc. despite the fact that these microprocessor, processor core, and electrical circuitry may nevertheless be shared among a plurality of module. A module described herein or an equivalent thereof may perform its respective functions alone or in conjunction with one or more other modules. A module described herein or an equivalent thereof may thus invoke one or more other modules by, for example, issuing one or more commands or function calls. The invocation of one or more other modules may be fully automated or may involve one or more user inputs. To the extent that a module includes a piece of software, the software is stored in a non-transitory computer accessible storage medium such as computer memory.

The term "computer readable storage medium" or "computer usable storage medium" as used herein refers to any non-transitory computer accessible storage medium that participates in providing instructions to processor 607 for execution. Such a medium may take many forms, including but not limited to, non-volatile media and volatile media. Non-volatile media includes, for example, optical or magnetic disks, such as disk drive 610. Volatile media includes dynamic memory, such as system memory 608. Common forms of computer readable storage media includes, for example, electromechanical disk drives (such as a floppy disk, a flexible disk, or a hard disk), a flash-based, RAM-based (such as SRAM, DRAM, SDRAM, DDR, MRAM, etc.), or any other solid-state drives (SSD), magnetic tape, any other magnetic or magneto-optical medium, CD-ROM, any other optical medium, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 600. According to other embodiments of the invention, two or more computer systems 600 coupled by communication link 615 (e.g., LAN, PTSN, or wireless network) may perform the sequence of instructions required to practice the invention in coordination with one another.

Computer system 600 may transmit and receive messages, data, and instructions, including program, i.e., application code, through communication link 615 and communication interface 614. Received program code may be executed by processor 607 as it is received, and/or stored in disk drive 610, or other non-volatile storage for later execution. In an embodiment, the computing system 600 operates in conjunction with a data storage system 631, e.g., a data storage system 631 that includes a database 632 that is readily accessible by the computing system 600. The computing system 600 communicates with the data storage system 631 through a data interface 633. A data interface 633, which is coupled with the bus 606, transmits and receives electrical, electromagnetic or optical signals that include data streams representing various types of signal information, e.g., instructions, messages and data. In embodiments of the invention, the functions of the data interface 633 may be performed by the communication interface 614.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

We claim:

1. A computer implemented method for verifying X-behavior in an electronic design, comprising:
   identifying, by at least one computer processor, at least a portion of an electronic design, the at least the portion including an input node, an output node, and an internal node located between the input node and the output node;
   generating, at one or more modules including at least a formal verification module that is stored at least partially in memory and includes or functions in tandem with the at least one computer processor, internal X-propagation verification results for the internal node based in part or in whole upon an internal precondition and an internal harmless condition for the internal node; and
   performing, by the at least one computer processor, X-propagation verification for the output node based in part upon one or more assumed properties that are assumed at the internal node.

2. The computer implemented method of claim 1, further comprising:
   identifying a first block located between the input node and the internal node and a second block located between the internal node and the output node;
   extracting the internal precondition based in part or in whole upon analyzing at least a portion of the first block; and
   extracting the internal harmless condition based in part or in whole upon analyzing at least a portion of the second block.

3. The computer implemented method of claim 2, further comprising at least one of:
   extracting an input harmless condition for the input node based in part or in whole upon analyzing at least a part of the first block; or
   extracting an output precondition for the output node based in part or in whole upon analyzing at least a part of the second block.

4. The computer implemented method of claim 2, further comprising at least one of:
   identifying an input precondition for the input node; and
   identifying an output harmless condition for the output node.

5. The computer implemented method of claim 2, further comprising:
   performing X-propagation verification for the internal node to generate the internal X-propagation verification results at least by formulating one or more X-behavior property for the internal node through combining the internal precondition and the internal harmless condition; and
   assuming the one or more assumed properties at the internal node based in part or in whole upon the internal X-propagation verification results for the internal node.

6. The computer implemented method of claim 1, further comprising:
   identifying a first hierarchy at which the at least the portion of the electronic design is located;
   identifying a first block located at a second hierarchy below the first hierarchy and between the input node and the internal node;
   identifying a second block located at the second hierarchy and between the internal node and the output node; and
   performing hierarchical verification decomposition for the at least the portion of the electronic design at the first hierarchy.

7. The computer implemented method of claim 6, further comprising:
   performing the hierarchical verification decomposition for the second hierarchy;
   identifying an input precondition for the input node; and
   identifying an output harmless condition for the output node.

8. The computer implemented method of claim 6, performing the hierarchical verification decomposition comprising:
- elaborating the second block while keeping a remainder of the at least the portion of the electronic design unelaborated;
- determining an output cone of influence for the output node;
- generating analysis results for the output node at least by analyzing at least a part of the second block at the second hierarchy based in part or in whole upon the output cone of influence; and
- extracting an output precondition for the output node based in part or in whole upon the analysis results for the output node.

9. The computer implemented method of claim 8, performing the hierarchical verification decomposition further comprising:
- identifying an output harmless condition for the output node; and
- extracting an internal harmless condition for the internal node based in part or in whole upon analysis results for the internal node.

10. The computer implemented method of claim 8, performing the hierarchical verification decomposition comprising:
- elaborating the first block while keeping a remainder of the at least the portion of the electronic design unelaborated;
- determining an input cone of influence for the input node;
- generating analysis results for the input node at least by analyzing at least a part of the first block at the second hierarchy based in part or in whole upon the input cone of influence; and
- extracting an input harmless condition for the input node based in part or in whole upon the analysis results for the input node.

11. The computer implemented method of claim 10, performing the hierarchical verification decomposition further comprising:
- identifying an input precondition for the input node; and
- extracting an internal precondition for the internal node based in part or in whole upon analysis results for the internal node.

12. The computer implemented method of claim 10, further comprising:
- identifying the internal precondition and the internal harmless condition for the internal node;
- generating internal X-propagation verification results for the internal node at least by performing the X-propagation verification for the internal node by formulating one or more X-behavior property for the internal node through combining the internal precondition and the internal harmless condition; and
- assuming one or more assumed properties for the internal node based in part or in whole upon the internal X-propagation verification results.

13. The computer implemented method of claim 12, further comprising:
- generating the output X-propagation verification results for the output node at least by performing the X-propagation verification for the output node using at least the one or more assumed properties at the internal node.

14. A system for verifying X-behavior in an electronic design, comprising:
- one or more modules, at least one of which is stored in part or in whole in memory and comprises at least one processor including one or more processor cores executing one or more threads in a computing system;
- a non-transitory computer accessible storage medium storing thereupon program code that includes a sequence of instructions that, when executed by the at least one processor, causes the at least one processor at least to:
- identify, by the at least one processor, at least a portion of an electronic design, the at least the portion including an input node, an output node, and an internal node located between the input node and the output node;
- a formal verification module that is stored at least partially in memory and includes or functions in tandem with the at least one processor and is configured to generate internal X-propagation verification results for the internal node based in part or in whole upon an internal precondition and an internal harmless condition for the internal node; and
- perform, by the at least one processor, X-propagation verification for the output node based in part upon one or more assumed properties that are assumed at the internal node.

15. The system of claim 14, wherein the program code includes the sequence of instructions that, when executed by the at least one processor, further cause the at least one processor to:
- identify a first block located between the input node and the internal node and a second block located between the internal node and the output node;
- extract the internal precondition based in part or in whole upon analyzing at least a portion of the first block; and
- extract the internal harmless condition based in part or in whole upon analyzing at least a portion of the second block.

16. The system of claim 15, wherein the program code includes the sequence of instructions that, when executed by the at least one processor, further cause the at least one processor to:
- identify a first hierarchy at which the at least the portion of the electronic design is located;
- identify a first block located at a second hierarchy below the first hierarchy and between the input node and the internal node;
- identify a second block located at the second hierarchy and between the internal node and the output node; and
- perform hierarchical verification decomposition for the at least the portion of the electronic design at the first hierarchy.

17. The system of claim 16, wherein the program code includes the sequence of instructions that, when executed by the at least one processor, further cause the at least one processor to:
- elaborate the second block while keeping a remainder of the at least the portion of the electronic design unelaborated;
- determine an output cone of influence for the output node;
- generate analysis results for the output node at least by analyzing at least a part of the second block at the second hierarchy based in part or in whole upon the output cone of influence;
- extract an output precondition for the output node based in part or in whole upon the analysis results for the output node;
- elaborate the first block while keeping a remainder of the at least the portion of the electronic design unelaborated;
- determine an input cone of influence for the input node;

generate analysis results for the input node at least by
analyzing at least a part of the first block at the second
hierarchy based in part or in whole upon the input cone
of influence; and
extract an input harmless condition for the input node
based in part or in whole upon the analysis results for
the input node.

18. The system of claim 17, wherein the program code includes the sequence of instructions that, when executed by the at least one processor, further cause the at least one processor to:
generate internal X-propagation verification results for
the internal node at least by performing the X-propagation verification for the internal node by comparing
the internal precondition to or with the internal harmless condition;
assume one or more assumed properties for the internal
node based in part or in whole upon the internal
X-propagation verification results; and
generating the output X-propagation verification results
for the output node at least by performing the X-propagation verification for the output node using at least the
one or more assumed properties at the internal node.

19. An article of manufacture comprising a non-transitory computer accessible storage medium having stored thereupon a sequence of instructions which, when executed by at least one processor or at least one processor core executing one or more threads, causes the at least one processor or the at least one processor core to perform a set of acts for verifying X-behavior in an electronic design, the set of acts comprising:
identifying, by at least one processor, at least a portion of
an electronic design, the at least the portion including
an input node, an output node, and an internal node
located between the input node and the output node;
generating, at one or more modules including a formal
verification module that is stored at least partially in
memory and includes or functions in tandem with the
at least one processor, internal X-propagation verification results for the internal node based in part or in
whole upon an internal precondition and an internal
harmless condition for the internal node; and
performing, by the at least one processor, X-propagation
verification for the output node based in part upon one
or more assumed properties that are assumed at the
internal node.

20. The article of manufacture of claim 19, the set of acts further comprising:
identifying a first block located between the input node
and the internal node and a second block located
between the internal node and the output node;
extracting the internal precondition based in part or in
whole upon analyzing at least a portion of the first
block; and
extracting the internal harmless condition based in part or
in whole upon analyzing at least a portion of the second
block.

21. The article of manufacture of claim 20, the set of acts further comprising:
performing X-propagation verification for the internal
node to generate the internal X-propagation verification
results at least by comparing the internal precondition
to or with the internal harmless condition;
assuming the one or more assumed properties at the
internal node based in part or in whole upon the internal
X-propagation verification results for the internal node;
and performing the X-propagation verification for the output
node based in part upon one or more assumed properties at the internal node.

22. The article of manufacture of claim 21, the set of acts further comprising:
identifying a first hierarchy at which the at least the
portion of the electronic design is located;
identifying a first block located at a second hierarchy
below the first hierarchy and between the input node
and the internal node;
identifying a second block located at the second hierarchy
and between the internal node and the output node; and
performing hierarchical verification decomposition for
the at least the portion of the electronic design at the
first hierarchy.

23. The article of manufacture of claim 22, the set of acts further comprising:
elaborating the second block while keeping a remainder
of the at least the portion of the electronic design
unelaborated;
determining an output cone of influence for the output
node;
generating analysis results for the output node at least by
analyzing at least a part of the second block at the
second hierarchy based in part or in whole upon the
output cone of influence; and
extracting an output precondition for the output node
based in part or in whole upon the analysis results for
the output node;
elaborating the first block while keeping a remainder of
the at least the portion of the electronic design unelaborated;
determining an input cone of influence for the input node;
generating analysis results for the input node at least by
analyzing at least a part of the first block at the second
hierarchy based in part or in whole upon the input cone
of influence; and
extracting an input harmless condition for the input node
based in part or in whole upon the analysis results for
the input node.

24. The article of manufacture of claim 23, the set of acts further comprising:
generating internal X-propagation verification results for
the internal node at least by performing the X-propagation verification for the internal node by comparing
the internal precondition to or with the internal harmless condition;
assuming one or more assumed properties for the internal
node based in part or in whole upon the internal
X-propagation verification results; and
generating output X-propagation verification results for
the output node at least by performing the X-propagation verification for the output node using at least the
one or more assumed properties at the internal node.

25. A computer implemented method for verifying X-behavior in an electronic design, comprising:
identifying, by at least one processor of a computing
system, at least a portion of an electronic design, the at
least the portion of the electronic design including a
first node;
determining, at one or more modules including a condition extraction module that is stored at least partially in
memory and includes or functions in tandem with the
at least one processor, at least one first precondition and
at least one first harmless condition for the first node;
and generating, by the at least one processor, one or more first X-behavior properties for the first node at least by combining the at least one first precondition and the at least one first harmless condition.

26. The computer implemented method of claim 25, further comprising:
    determining the at least one first precondition for the first node at least by performing one or more first analyses on first logic driving the first node when the first node is an internal node for the at least the portion of the electronic design; and
    determining the at least one first harmless condition for the first node at least by performing one or more analyses on second logic driven by the first node when the first node is the internal node for the at least the portion of the electronic design.

27. The computer implemented method of claim 25, further comprising:
    determining the at least one first precondition for the first node at least by performing one or more analyses on logic driving the first node when the first node is an output node for the at least the portion of the electronic design; and
    identifying the at least one first harmless when the first node is the output node for the at least the portion of the electronic design.

28. The computer implemented method of claim 25, further comprising:
    determining the at least one first harmless condition for the first node at least by performing one or more analyses on logic driving the first node when the first node is an input node for the at least the portion of the electronic design; and
    identifying the at least one first precondition when the first node is the output node for the at least the portion of the electronic design.

29. The computer implemented method of claim 25, further comprising:
    identifying a second node in the at least the portion of the electronic design, wherein the second node is driving or driven by the first node;
    determining, at the one or more modules including the condition extraction module, at least one second precondition and at least one second harmless condition for the second node based in part or in whole upon the at least one first precondition, the at least one first harmless condition, or both the at least one first precondition and the at least one first harmless condition for the first node; and
    generating one or more second X-behavior properties for the second node at least by combining the at least one second precondition and the at least one second harmless condition.

30. The computer implemented method of claim 29, further comprising:
    identifying the at least one second precondition for the second node when the second node is an input node for the at least the portion of the electronic design; and
    determining the at least one second harmless condition for the second node at least by performing one or more second analyses on logic driven by the second node when the second node is the input node for the at least the portion of the electronic design.

31. The computer implemented method of claim 29, further comprising:
    determining the at least one second precondition for the second node at least by performing one or more first analyses on first logic driving the second node when the second node is an internal node for the at least the portion of the electronic design; and
    determining the at least one second harmless condition for the second node at least by performing one or more second analyses on second logic driven by the second node when the second node is the internal node for the at least the portion of the electronic design.

32. The computer implemented method of claim 29, further comprising:
    identifying the at least one second harmless condition for the second node when the second node is an output node for the at least the portion of the electronic design; and
    determining the at least one second precondition for the second node at least by performing one or more analyses on logic driving the second node when the second node is the output node for the at least the portion of the electronic design.

* * * * *